United States Patent
Nakajima

(10) Patent No.: US 8,171,980 B2
(45) Date of Patent: May 8, 2012

(54) PROCESS FOR PRODUCING THERMOELECTRIC SEMICONDUCTOR ALLOY, THERMOELECTRIC CONVERSION MODULE, THERMOELECTRIC POWER GENERATING DEVICE, RARE EARTH ALLOY, PRODUCING PROCESS THEREOF, THERMOELECTRIC CONVERSION MATERIAL, AND THERMOELECTRIC CONVERSION SYSTEM USING FILLED SKUTTERUDITE BASED ALLOY

(75) Inventor: Kenichiro Nakajima, Chichibu (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 13/179,287

(22) Filed: Jul. 8, 2011

(65) Prior Publication Data

US 2011/0265919 A1 Nov. 3, 2011

Related U.S. Application Data

(60) Division of application No. 11/583,100, filed on Oct. 19, 2006, now Pat. No. 8,006,741, which is a continuation of application No. PCT/JP2005/008103, filed on Apr. 21, 2005.

(60) Provisional application No. 60/565,521, filed on Apr. 27, 2004, provisional application No. 60/603,268, filed on Aug. 23, 2004, provisional application No. 60/607,345, filed on Sep. 7, 2004, provisional application No. 60/640,242, filed on Jan. 3, 2005.

(30) Foreign Application Priority Data

| Apr. 21, 2004 | (JP) | 2004-125153 |
| Aug. 16, 2004 | (JP) | 2004-236712 |
| Aug. 26, 2004 | (JP) | 2004-246830 |
| Dec. 24, 2004 | (JP) | 2004-374218 |

(51) Int. Cl.
*B22D 30/00* (2006.01)
(52) U.S. Cl. ........ 164/122; 420/590
(58) Field of Classification Search ........ 164/122, 164/128, 348; 420/590
See application file for complete search history.

(56) References Cited

U.S. PATENT DOCUMENTS

| 6,069,312 | A | 5/2000 | Fleurial et al. |
| 6,207,886 | B1 | 3/2001 | Kusakabe et al. |
| 7,705,233 | B2 * | 4/2010 | Nakajima ........ 136/201 |
| 7,849,909 | B2 | 12/2010 | Nakajima |

(Continued)

FOREIGN PATENT DOCUMENTS

EP 0 969 526 A1 1/2000

(Continued)

OTHER PUBLICATIONS

Yamanaka et al, "Heusler Alloy Thermoelectric Conversion Materials", Kinzoku (Metals), 2004, vol. 74, No. 8, pp. 54-57.

(Continued)

*Primary Examiner* — Kevin P Kerns
(74) *Attorney, Agent, or Firm* — Sughrue Mion, PLLC

(57) ABSTRACT

A process for producing a rare earth alloy comprises heating a raw material alloy to be a molten alloy, and quench-solidifying the molten alloy, wherein the raw material alloy is compounded so as to have a composition represented by the formula: $RE_x(Co_{1-y}M_y)_4Sb_{12}$ (wherein RE is at least either one member of La and Ce, M is at least one member selected from the group consisting of Ti, Zr, Sn, Cu, Zn, Mn and Pb, $0<x\leq1$, and $0<y<1$).

6 Claims, 7 Drawing Sheets

U.S. PATENT DOCUMENTS

| | | | | |
|---|---|---|---|---|
| 7,997,325 | B2* | 8/2011 | Nakajima | 164/122 |
| 8,006,741 | B2* | 8/2011 | Nakajima | 164/122 |
| 2002/0179135 | A1 | 12/2002 | Shutoh et al. | |

FOREIGN PATENT DOCUMENTS

| | | |
|---|---|---|
| EP | 1 083 610 A1 | 3/2001 |
| JP | 10-102170 A | 4/1998 |
| JP | 11-135840 A | 5/1999 |
| JP | 2000-252526 A | 9/2000 |
| JP | 2001-189495 A | 7/2001 |
| JP | 2002-026400 A | 1/2002 |
| JP | 2002-033526 A | 1/2002 |
| JP | 2003-197985 A | 7/2003 |
| JP | 2003-304006 A | 10/2003 |
| JP | 2004-119647 A | 4/2004 |
| JP | 2004-253618 A | 9/2004 |
| JP | 2006-165125 A | 6/2006 |
| WO | 03/019681 A1 | 3/2003 |
| WO | 2004/017435 A1 | 2/2004 |
| WO | WO 2004/017435 A1 * | 2/2004 |

OTHER PUBLICATIONS

Matsuura et al., "Doping effects on thermoelectric properties of the pseudogap Fe2VA1 system", J Japan Inst of metals, 2002, p. 767-771, vol. 66, No. 7, XP008064324.

Shutoh et al, "Thermoelectric properties of the Tix(Zr0.5Hf0.5)1-xNiSn Half-Heusler Compounds", Thermoelectrics, 2003 22nd International Conference on Thermoelectrics, 2003, p. 312-315, XP008064313.

Danebrock et al., "Magnetic propoerties of alkaline earth and lanthanoid iron antimonides AFeSb12 (A=Ca, Sr, Ba, La—Nd, Sm, Eu) with the LaFe4P12 structure", Journal of Physiology and Chemical Solids, 1996, vol. 57, No. 4, pp. 381-387.

Danebrock et al., "Magnetic propoerties of alkaline earth and lanthanoid iron antimonides AFeSb12 (A=Ca, Sr, Ba, La—Nd, Sm, Eu) with the LaFe4P12 structure", J. Phys. Chem. Solids., 1996, vol. 57, No. 4, pp. 381-387.

International Search Report issued in Application No. PCT/JP2005/008103 mailed Jan. 13, 2006.

Notice of Reasons for Rejection issued in Japanese Patent Application No. 2005-123536 mailed Dec. 7, 2010.

Notice of Reasons of Rejection issued in Japanese Patent Application No. 2005-369885 mailed May 24, 2011.

Shutoh et al, "Thermoelectric properties of the Tix(Zr0.5Hf0.5)1-xNiSn Half-Heusler Compounds", 22nd International Conference on Thermoelectrics, 2003, p. 312-315, XP008064313.

Yamanaka et al, "Heusler Alloy Thermoelectric Conversion Materials Expected As Next-Generation High-Performance Materials", Kinzoku (Metals), 2004, vol. 74, No. 8, pp. 54-57.

* cited by examiner

PROCESS FOR PRODUCING THERMOELECTRIC SEMICONDUCTOR ALLOY, THERMOELECTRIC CONVERSION MODULE, THERMOELECTRIC POWER GENERATING DEVICE, RARE EARTH ALLOY, PRODUCING PROCESS THEREOF, THERMOELECTRIC CONVERSION MATERIAL, AND THERMOELECTRIC CONVERSION SYSTEM USING FILLED SKUTTERUDITE BASED ALLOY

CROSS-REFERENCE

This is a divisional application of U.S. patent application Ser. No. 11/583,100, filed Oct. 19, 2006, now U.S. Pat. No. 8,006,741, which is a continuation of PCT/JP2005/008103 filed Apr. 21, 2005, the disclosure of which is incorporated by reference, and priority is claimed on Japanese Patent Application No. 2004-374218, filed Dec. 24, 2004, Japanese Patent Application No. 2004-246830, filed Aug. 26, 2004, Japanese Patent Application No. 2004-236712, filed Aug. 16, 2004, Japanese Patent Application No. 2004-125153, filed Apr. 21, 2004, and domestic benefit is claimed from U.S. Provisional Patent Application No. 60/565,521 filed Apr. 27, 2004, U.S. Provisional Patent Application No. 60/603,268 filed Aug. 23, 2004, U.S. Provisional Patent Application No. 60/607,345 filed Sep. 7, 2004, and U.S. Provisional Patent Application No. 60/640,242 filed Jan. 3, 2005. The contents of each of the four Japanese Patent Applications for which priority is claimed and the contents of each of the four U.S. Provisional Patent Applications for which domestic benefit is claimed are incorporated herein by reference.

TECHNICAL FIELD

The present invention relates to a production method of a thermoelectric semiconductor alloy, and a high-performance thermoelectric power generating device using a thermoelectric semiconductor alloy produced by the production method.

The present invention relates to rare earth alloys suitable for a thermoelectric conversion element of directly converting heat into electricity by the Seebeck effect.

The present invention relates to a device and a method for generating thermoelectric power by utilizing a thermoelectric conversion element. More specifically, the present invention relates to a thermoelectric conversion system using a filled skutterudite-based alloy for the thermoelectric conversion element of directly converting heat into electricity by the Seebeck effect.

BACKGROUND ART

To cope with the regulation for emission of carbonic acid gas and energy conservation, thermoelectric power generation utilizing thermoelectric conversion of converting waste heat directly into electricity is attracting attention. This thermoelectric conversion is effected by such a mechanism that when temperature difference is generated by assigning one end of n-type and p-type semiconductors to a high temperature and another end to a low temperature, potential difference is caused and electricity is obtained. The principle thereof has long been known.

For example, JP-A-2001-189495 (the term "JP-A" as used herein means an "unexamined published Japanese patent application"), WO03/019681 A1, JP-A-2004-253618, JP-A-2004-119647, Yamanaka et al., Kinzoku (Metals), Vol. 74 (8), page 54 (2004), Matsuura et al., Journal of Japan Institute of Metals, Vol. 66 (7), page 767 (2002), and S. Shuto et al., Proc. 22nd International Conference on Thermoelectrics, 312 (2003) disclose various types of thermoelectric conversion material.

Conventional thermoelectric power generation had been used only for limited uses such as application to space probe, because the semiconductor used for the power generation is very expensive, but in the late 1990s, a high-performance semiconductor was newly discovered and since then, aggressive development such as study on materials for practical use, production of modules and packaging test has been made.

Examples of the substance taken notice of as a next-generation thermoelectric semiconductor include filled skutterudite type, cobalt oxide, silicide and Heusler type. It is recognized that with these materials, high electric conductivity, high Seebeck coefficient and low thermal conductivity can be achieved at the same time. For enhancing the performance of each material, a great deal of effort is being made.

Along with elucidation of properties as a semiconductor, alloys having a Heusler or half Heusler structure have come to draw attention as an excellent thermoelectric semiconductor.

The Heusler alloy is represented by the formula: $A_{3-x}B_xC$, wherein A and B are each a transition metal, C is a Group III or IV metal, and a space group is Fm3m. The half Heusler alloy is represented by the formula: ABC, wherein A and B are each a transition metal, C is a Group III or IV metal, and the space group is F43m.

In the case of using a Heusler alloy as a thermoelectric semiconductor, the design is difficult due to numerous combinations of elements, and one proposed guideline therefor is a method of using an electronic number as a rough standard.

With respect to the thermoelectric semiconductor having a Heusler structure, for example, Nishino et al. have reported an $Fe_2VAl$ system of giving an output factor comparable to that of Bi—Te system in the vicinity of room temperature. The $Fe_2VAl$ system is expected in view of the theoretical value to exhibit thermoelectric performance higher than the Bi—Te system and also from the aspect of expensiveness or toxicity, is noteworthy as a practical material.

At present, for the production of a half Heusler alloy as a thermoelectric conductor for use in middle and high temperature regions, a heat treatment for a long time of about 10 days is performed. Considering mass production, the heat treatment for such a long time is not preferred because this causes increase in the cost.

Also, it is known that in the TiNiSn system having a half Heusler structure, when Ti is replaced by Zr or Hr, both high output factor and low thermal conductivity can be achieved in a high temperature region of 300° C. or more and the dimensionless figure of merit ZT as a rough standard for the performance of a practical material exceeds 1.0 at 693K. The performance of this system is expected to be enhanced in future.

When a Heusler alloy is produced by casting, high melting point metals such as Ti, V and Zr are contained therein in many cases and a skilled technique is required for the quench-solidification of high-temperature molten metal. Also, a casting technique in vacuum induction furnace and inert atmosphere is necessary because of handling of a readily oxidizable metal as represented by Ti.

DISCLOSURE OF INVENTION

In most of conventional methods for producing a thermoelectric semiconductor, the alloy raw material is melted by arc melting, and annealing of the molten alloy for a long time is performed multiple times or a shaped body is produced at high temperature under high pressure by using a special heat shaping apparatus. Thus, the productivity is not taken account of at all.

In the light of these problems, an object in the present invention in the present invention is to provide a high-performance thermoelectric conversion module, a high-performance thermoelectric power generating device, and a thermoelectric semiconductor alloy for constituting such a module or device.

Out of intermetallic compounds such as $CoSb_3$ having a skutterudite-type crystal structure, which are one conventional thermoelectric conversion material, the thermoelectric conversion material having a filled skutterudite structure is low in the thermal conductivity and therefore, promising as a thermoelectric conversion material for use particularly in high-temperature regions.

The filled skutterudite-based alloy is an intermetallic compound represented by the formula: $RT_4Pn_{12}$ (wherein R is a rare earth metal, T is a transition metal, and Pn is an element such as P, As or Sb), where an atom with a large mass, such as rare earth metal (R), is filled in a part of interstitial present in a crystal having a skutterudite structure represented by the formula: $TPn_3$ (wherein T is a transition metal, and Pn is an element such as P, As and Sb).

The filled skutterudite-type thermoelectric conversion material can be produced as either p-type or n-type by appropriately selecting the transition metal T. Moreover, this material has no anisotropy and therefore, the crystal need not be oriented, so that the production process can be simple and easy and excellent productivity can be ensured.

The p-type and n-type filled skutterudite-type thermoelectric conversion elements each in the block form are electrically joined directly or through a metal conductor to create p-n junction, or thermoelectric conversion materials comprising p-type and n-type filled skutterudite-based alloys, respectively, are contacted in a horseshoe shape to create p-n junction, whereby a module of thermoelectric conversion elements can be produced. Furthermore, when a plurality of thermoelectric conversion elements having p-n junction are connected and a heat exchanger is joined therewith, a thermoelectric conversion system is established and electricity can be taken out by the effect of temperature difference.

The thermoelectric figure of merit ZT of the thermoelectric conversion element can be expressed by:

$$ZT = \alpha^2 T/\kappa\rho$$

wherein $\alpha$ is Seebeck coefficient, $\rho$ is electrical resistivity, $\kappa$ is thermal conductivity and T is absolute temperature.

As seen from this formula, in order to enhance the performance of the thermoelectric conversion element, it is demanded to elevate the Seebeck coefficient and reduce the electrical resistivity and thermal conductivity.

However, as known from the Wiedemann-Franz law, these elevation and reduction are theoretically difficult when the thermal conduction is governed by electronic conduction.

On the other hand, in the case of filled skutterudite, it is recognized that when a rare earth metal atom is filled in interstitial of a crystal having a skutterudite structure, the rare earth metal atom vibrates due to weak bonding to Sb, and phonon scattering dominated by this vibration occurs, as a result, the thermal conductivity decreases.

Also, the filled skutterudite expresses an apparently large effective mass ascribable to the heavy fermion-like behavior resulting from containing a rare earth metal and therefore, it is expected that both reduction of electrical resistance and elevation of Seebeck coefficient can be realized at the same time by doping or substituting a specific element.

For example, in JP-A-11-135840, specifically, for improving the element performance, in the case of an n-type filled skutterudite element, a technique of replacing Co on the transition metal site of $YbCo_4Sb_{12}$ by Pt or replacing Ce on the rare earth metal site of $CeFeCo_3Sb_{12}$ by Zr or Ba, thereby enhancing the properties has been reported. In the case of a p-type filled skutterudite element, it is known that when Fe on the transition metal site of $YbFe_4Sb_{12}$ is replaced by Ni, the performance is enhanced.

In order to spread a thermoelectric conversion system, the properties of the thermoelectric conversion element must be enhanced without increasing the raw material cost, but metals used in conventional methods all are expensive or require care in the handling. Therefore, enhancement of properties by using more inexpensive and easily handleable elements is demanded.

In most of conventional production methods, powders are mixed to give a predetermined composition and plasma-sintered, but this is unsuitable for industrial mass production and moreover, replacement of a specific site by the uniform addition of a trace element is difficult.

By taking account of these problems, an object in the present invention is to provide novel rare earth alloys using easily available raw materials, being suitable for mass production and ensuring sufficiently high performance as a thermoelectric conversion element.

The thermoelectric conversion material comprising a filled skutterudite-based alloy is low in the thermal conductivity as compared with intermetallic compounds such as $CoSb_3$ having a skutterudite-type crystal structure, which are one conventional thermoelectric conversion material, and therefore, this material is promising as a thermoelectric conversion material for use particularly in high-temperature regions.

The filled skutterudite-based alloy is an intermetallic compound represented by the formula: $RT_4Pn_{12}$ (wherein R is a rare earth metal, T is a transition metal, and Pn is an element such as P, As or Sb), where an atom with a large mass, such as rare earth metal (R), is filled in a part of interstitial present in a crystal having a skutterudite structure represented by the formula: $TPn_3$ (wherein T is a transition metal, and Pn is an element such as P, As and Sb). It is recognized that when a rare earth metal atom is filled in interstitial of a crystal having a skutterudite structure, the rare earth metal atom vibrates due to weak bonding to Pn, and phonon scattering dominated by this vibration occurs, as a result, the thermal conductivity of the thermoelectric conversion material comprising a filled skutterudite-based alloy decreases.

It is also recognized that the filled skutterudite-based alloy can be produced as either p-type or n-type by appropriately selecting R or T. For the purpose of controlling the p-type or n-type, attempts are being made to replace a part of the T component comprising Fe by Co, Ni or the like.

The p-type and n-type filled skutterudite-based alloy blocks produced in this way are joined directly or through a metal conductor to create p-n junction, whereby a thermoelectric conversion element can be produced. Also, thermoelectric conversion materials comprising p-type and n-type filled skutterudite-based alloys, respectively, are contacted in a horseshoe shape to create p-n junction, whereby a module of thermoelectric conversion elements can be produced.

Furthermore, when a plurality of thermoelectric conversion elements having p-n junction are connected and a heat exchanger is joined therewith, a thermoelectric conversion system is established and electricity can be taken out by the effect of temperature difference.

Conventionally, for producing a thermoelectric conversion element by using a filled skutterudite-based alloy, high-purity powdered raw materials such as rare earth metal, transition metal and P, As or Sb are weighed to give an objective filled skutterudite alloy composition and mixed, the mixture is once calcined at a temperature of 800° C. or less, the calcined product is again ground and then heated to 800° C. by hot pressing or plasma discharge sintering to produce a sintered body, and the sintered body is cut to obtain the element.

However, in this method, the crystal grain diameter of the filled skutterudite-based alloy is greatly affected by the state of powdered raw materials. Also, unless the sintering conditions are strictly controlled, the crystal grain diameter grows large and the performance of the thermoelectric conversion element disadvantageously decreases.

For example, in JP-A-2000-252526, for the purpose of solving these problems, as concerns an Sb-containing skutterudite-type thermoelectric material which is one of filled skutterudite-type thermoelectric conversion materials, a technique of constituting the sintered body from pulverized crystal grains having a skutterudite structure and at the same time, dispersing a metal oxide in the grain boundary of the crystal grain has been proposed.

According to this method, the crystal grain having a skutterudite structure can have an average crystal grain diameter of 20 μm or less. However, this method has a problem that due to interposition of a metal oxide in the crystal grain boundary, the electric conductivity decreases.

As another method of producing a thermoelectric conversion material comprising a filled skutterudite-based alloy, for example, in JP-A-2002-26400, a method of heat-treating a ribbon produced by a liquid quenching process is known. In the general liquid quenching process, while rotating a roll at a high speed, a molten metal is poured thereon under pressure through a nozzle produced by punching a hole of about 1 mm at the distal end of a quartz-made tube.

However, in this method, the ribbon is amorphous or contains a decomposition product such as $Sb_2Fe$ and Sb and therefore, a filled skutterudite element having a sufficiently high purity can be hardly obtained. Also, for realizing use in practice, heat treatment at 873 to 1,073K for 5 hours or more must be performed.

Furthermore, these methods described above all have a problem that when the process from the preparation of raw materials until sintering is performed in an atmosphere allowing for the presence of oxygen, such as air, the rare earth metal element in the filled skutterudite structure crystal is eliminated from the lattice and a part of the filled skutterudite structure is decomposed into $Sb_2Fe$ and Sb.

In the present invention, the filled skutterudite-based alloy is produced by a strip casting method, whereby the problems in conventional methods of producing a filled skutterudite-type thermoelectric conversion material can be overcome. That is, the present invention provides a method for producing a filled skutterudite-based alloy usable as-is for a thermoelectric conversion element, and an alloy produced by the method, which can be suitably used for thermoelectric conversion elements.

Furthermore, the present invention provides a thermoelectric conversion module greatly elevated in the thermal conversion efficiency by producing the thermal conversion element from an alloy comprising only a filled skutterudite phase.

The present inventors have found that when a raw material alloy is melted and the molten alloy is quench-solidified at an appropriate cooling rate, a thermoelectric semiconductor alloy comprising nearly a single phase can be produced.

The present invention has been accomplished based on this finding and includes the following inventions.

(1) A process for producing a skutterudite compound comprising:
heating a raw material alloy to obtain a molten alloy, and
quench-solidifying a molten alloy at a cooling rate of $1\times10^2$ to $1\times10^{3}$ ° C./sec.

(2) A process for producing a skutterudite compound as set forth in (1), in which the skutterudite compound is a filled skutterudite compound.

(3) A process for producing a Heusler type alloy including:
heating a raw material alloy to obtain a molten alloy, and
quench-solidifying a molten alloy at a cooling rate of $1\times10^2$ to $1\times10^{3}$ ° C./sec.

(4) A process for producing a Heusler type alloy as set forth in (3), in which the Heusler type alloy contains a Heusler phase.

(5) A process for producing a Heusler type alloy as set forth in (3) or (4), in which the Heusler type alloy contains a half Heusler phase.

(6) A process for producing a Heusler type alloy as set forth in any one of (3) to (5), in which the Heusler type alloy contains a Heusler phase by not less than 90%.

(7) A process for producing a Heusler type alloy as set forth in any one of (3) to (6), in which the Heusler type alloy contains a different type element by not less than 0.01 mass % in the Heusler phase.

(8) A process for producing a rare earth alloy including:
heating a raw material alloy to be a molten alloy, and
quench-solidifying the molten alloy.

(9) A process for producing a rare earth alloy as set forth in (8), in which the quench-solidifying is performed at a rate not lower than $1\times10^{2}$ ° C./sec.

(10) A process for producing a rare earth alloy as set forth in (8), in which the quench-solidifying is performed at a rate of $1\times10^2$ to $1\times10^{3}$ ° C./sec.

(11) A process for producing a rare earth alloy as set forth in (8), in which the quench-solidifying during 1500 to 1700° C. is performed at a rate of $1\times10^2$ to $1\times10^{3}$ ° C./sec.

(12) A process for producing a rare earth alloy as set forth in (8), in which the quench-solidifying is performed by a strip casting method.

(13) A process for producing a rare earth alloy as set forth in (8), in which the rare earth alloy is one selected from the group consisting of a Heusler alloy, a half Heusler alloy, and a skutterudite alloy.

(1-1) A process for producing a Heusler alloy, including quench-solidifying a molten alloy at a cooling rate of $1\times10^2$ to $1\times10^{3}$ ° C./sec to produce a Heusler alloy represented by the formula: $A_{3-x}B_xC$ (wherein A and B each is at least one member selected from transition metals consisting of Fe, Co, Ni, Ti, V, Cr, Zr, Hf, Nb, Mo, Ta and W, and C is at least one member selected from Group 13 or 14 elements consisting of Al, Ga, In, Si, Ge and Sn).

(1-2) A process for producing a Heusler alloy, including quench-solidifying a molten alloy at a cooling rate of $1\times10^2$ to $1\times10^{3}$ ° C./sec to produce a Heusler alloy represented by the formula: ABC (wherein A and B each is at least one member selected from transition metals consisting of Fe, Co, Ni, Ti, V, Cr, Zr, Hf, Nb, Mo, Ta and W, and C is at least one member selected from Group 13 or 14 elements consisting of Al, Ga, In, Si, Ge and Sn).

(1-3) An alloy produced by the production method described in (1-1) or (1-2).

(1-4) The alloy as described in (1-3), in which the ratio of strongest peak of the Heusler phase or half Heusler phase is 85% or more.

(1-5) The alloy as described in (1-3) or (1-4), in which the average particle diameter is from 1 to 100 μm.

(1-6) A thermoelectric conversion element using the alloy described in any one of (1-3) to (1-5).
(1-7) A thermoelectric conversion module using the thermoelectric conversion element described in (1-6).
(1-8) A thermoelectric power generating device using the thermoelectric conversion module described in (1-7).
(1-9) A waste heat recovery system using the thermoelectric power generating device described in (1-8).
(1-10) A solar heat utilizing system using the thermoelectric power generating device described in (1-8).

The present inventors have found that when a raw material alloy is melted and solidified at an appropriate cooling rate, a filled skutterudite alloy comprising a skutterudite phase nearly as a single phase can be produced.

When the process in the present invention in the present invention is employed, replacement of a specific site even by a trace element can be performed uniformly in the entire alloy and this is suited for mass production. However, depending on the alloy composition, the element fails in having sufficiently high performance.

As a result of investigations to elevate the element performance in this production process, the present inventors have found that when in an n-type filled skutterudite thermoelectric conversion material represented by $RE_x(Co_{1-y}M_y)_4Sb_{12}$, RE is Ce or La, x is $0<x\leq1$, preferably $0.01\leq x\leq1$, and Co is replaced by at least one member M selected from Cu, Mn and Zn, which are relatively easily available and easily handleable, in the range of $0<y<1$, preferably $0.01\leq y\leq0.15$, the thermoelectric conversion property can be enhanced.

It has been also found that when in a p-type filled skutterudite thermoelectric conversion material represented by $RE_x(Fe_{1-y}M_y)_4Sb_{12}$ not using Co at all, the rare earth element RE is Ce or La, x is $0<x\leq1$, preferably from 0.01 to 1, and Fe is replaced by at least one member M selected from Ti, Zr, Sn and Pb in the range of $0<y<1$, preferably $0.01\leq y\leq0.15$, the thermoelectric conversion property can be enhanced.

The second aspect of the present invention includes the following modes.
(2-1) A rare earth alloy represented by $RE_x(Fe_{1-y}M_y)_4Sb_{12}$ (wherein RE is at least either one member of La and Ce, M is at least one member selected from the group consisting of Ti, Zr, Sn and Pb, $0<x\leq1$, and $0<y<1$).
(2-2) The rare earth alloy as described in (1) above, in which x is in the range of $0.01\leq x\leq1$ and y is in the range of $0.01\leq y\leq0.15$.
(2-3) The rare earth alloy as described in (2-1) or (2-2) above, in which the crystal structure is a skutterudite-type crystal structure.
(2-4) The rare earth alloy as described in (2-1) or (2-2) above, in which the crystal structure is a filled skutterudite-type crystal structure.
(2-5) The rare earth alloy as described in any one of (2-1) to (2-4), in which the average thickness of the rare earth alloy is from 0.1 to 2 mm.
(2-6) A p-type thermoelectric conversion material comprising the rare earth alloy described in any one of (2-1) to (2-5) above.
(2-7) A rare earth alloy represented by $RE_x(Co_{1-y}M_y)_4Sb_{12}$ (wherein RE is at least either one member of La and Ce, M is at least one member selected from the group consisting of Ti, Zr, Sn and Pb, $0<x\leq1$ and $0<y<1$).
(2-8) The rare earth alloy as described in (2-7) above, in which x is in the range of $0.01\leq x\leq1$ and y is in the range of $0.01\leq y\leq0.15$.
(2-9) The rare earth alloy as described in (2-7) or (2-8) above, in which the crystal structure is a skutterudite-type crystal structure.
(2-10) The rare earth alloy as described in (2-7) or (2-8) above, in which the crystal structure is a filled skutterudite-type crystal structure.
(2-11) The rare earth alloy as described in any one of (2-7) to (2-10), in which the average thickness of the rare earth alloy is from 0.1 to 2 mm.
(2-12) An n-type thermoelectric conversion material comprising the rare earth alloy described in any one of (2-7) to (2-11) above
(2-13) A process for producing a rare earth alloy, including weighing raw materials to give a composition of $RE_x(Fe_{1-y}M_y)_4Sb_{12}$ (wherein RE is at least either one member of La and Ce, M is at least one member selected from the group consisting of Ti, Zr, Sn and Pb, $0<x\leq1$, and $0<y<1$), melting the raw materials in an inert gas atmosphere, and then quench-solidifying the melt.
(2-14) The process for producing a rare earth alloy as described in (2-13) above, in which the quench-solidification is performed by a strip casting method.
(2-15) The process for producing a rare earth alloy as described in (2-13) or (2-14), in which the cooling rate at the quench-solidification is $1\times10^{2\circ}$ C./sec or more.
(2-16) A process for producing a rare earth alloy, including weighing raw materials to give a composition of $RE_x(Co_{1-y}M_y)_4Sb_{12}$ (wherein RE is at least either one member of La and Ce, M is at least one member selected from the group consisting of Ti, Zr, Sn and Pb, $0<x\leq1$, and $0<y<1$), melting the raw materials in an inert gas atmosphere, and then quench-solidifying the melt.
(2-17) The process for producing a rare earth alloy as described in (2-16) above, in which the quench-solidification is performed by a strip casting method.
(2-18) The process for producing a rare earth alloy as described in (2-16) or (2-17), in which the cooling rate at the quench-solidification is $1\times10^{2\circ}$ C./sec or more.
(2-19) A thermoelectric conversion element comprising a combination of a rare earth alloy described in at least one of (2-1) to (2-4) above and a rare earth alloy described in at least one of (2-7) to (2-10) above.
(2-20) A thermoelectric conversion module using the thermoelectric conversion element described in (2-19) above.
(2-21) A thermoelectric power generating device using the thermoelectric conversion module described in (2-19) above.
(2-22) A thermoelectric power generating method using the thermoelectric conversion module described in (2-19) above.
(2-23) A waste heat recovery system using the thermoelectric power generating device described in (2-21) above.
(2-24) A solar heat utilizing system using the thermoelectric power generating device described in (2-21) above.

The present invention includes the following inventions.
(3-1) A thermoelectric conversion module using a filled skutterudite-based alloy produced by melting an alloy raw material comprising a rare earth metal R (wherein R is at least one member selected from La, Ce, Pr, Nd, Sm, Eu and Yb), a transition metal T (wherein T is at least one member selected from Fe, Co, Ni, Os, Ru, Pd, Pt and Ag) and a metal antimony (Sb), and quench-solidifying the molten metal by a strip casting method.
(3-2) A thermoelectric power generating device using the thermoelectric conversion module described in (3-1).
(3-3) A thermoelectric power generating method using the thermoelectric conversion module described in (3-1).
(3-4) A waste heat recovery system using the thermoelectric power generating device described in (3-2).

(3-5) A solar heat utilizing system using the thermoelectric power generating device described in (3-2).

The present inventors have found that when a raw material alloy is melted and solidified at an appropriate cooling rate, a filled skutterudite alloy comprising a skutterudite phase nearly as a single phase can be produced.

When the method in the present invention is employed, replacement of a specific site even by a trace element can be performed uniformly in the entire alloy and this is suited for mass production. However, depending on the alloy composition, the element fails in having sufficiently high performance.

As a result of investigations to elevate the element performance in this production method, the present inventors have found that when in an n-type filled skutterudite thermoelectric conversion material represented by $Ce(Co_{1-x}M_x)_4Sb_{12}$, CO is replaced by at least one member M selected from Cu, Mn and Zn, which are relatively easily available and easily handleable, preferably in the range of x from 0.01 to 0.15, the thermoelectric conversion property can be enhanced.

It has been also found that when in a p-type filled skutterudite thermoelectric conversion material represented by $La(Fe_{1-x}M_x)_4Sb_{12}$ not using Co at all, Fe is replaced by at least one member M selected from Ti, Zr, Sn and Pb, preferably in the range of x from 0.01 to 0.15, the thermoelectric conversion property can be enhanced.

The present invention has been accomplished based on these findings and includes the following modes.

(4-1) A rare earth element-containing alloy represented by $La(Fe_{1-x}M_x)_4Sb_{12}$ (wherein M is at least one member selected from the group consisting of Ti, Zr, Sn and Pb, and $0<x<1$).

(4-2) The rare earth element-containing alloy as described in (4-1) above, wherein x is in the range of 0.01 to 0.15.

(4-3) The rare earth element-containing alloy as described in (4-1) or (4-2) above, wherein the crystal structure is a skutterudite-type crystal structure.

(4-4) The rare earth element-containing alloy as described in (4-1) or (4-2) above, wherein the crystal structure is a filled skutterudite-type crystal structure.

(4-5) A p-type thermoelectric conversion material comprising the rare earth element-containing alloy described in any one of (4-1) to (4-4) above.

(4-6) A rare earth element-containing alloy represented by $Ce(Co_{1-x}M_x)_4Sb_{12}$ (wherein M is at least one member selected from the group consisting of Cu, Zn and Mn, and $0<x<1$).

(4-7) The rare earth element-containing alloy as described in (4-6) above, in which x is in the range of 0.01 to 0.15.

(4-8) The rare earth element-containing alloy as described in (4-6) or (4-7) above, in which the crystal structure is a skutterudite-type crystal structure.

(4-9) The rare earth element-containing alloy as described in (4-6) or (4-7) above, wherein the crystal structure is a filled skutterudite-type crystal structure.

(4-10) An n-type thermoelectric conversion material comprising the rare earth element-containing alloy described in any one of (4-6) to (4-9) above (4-11) A method for producing a rare earth element-containing alloy, comprising weighing raw materials to give a composition of $La(Fe_{1-x}M_x)_4Sb_{12}$ (wherein M is at least one member selected from the group consisting of Ti, Zr, Sn and Pb, and $0<x<1$), melting the raw materials in an inert gas atmosphere, and then quench-solidifying the melt.

(4-12) The method for producing a rare earth element-containing alloy as described in (4-11) above, in which the quench-solidification is performed by a strip casting method.

(4-13) The method for producing a rare earth element-containing alloy as described in (4-11) or (4-12), in which the cooling rate from 1,500° C. to 700° C. at the quench-solidification is from $10^2$ to $10^{3}$° C./sec.

(4-14) A process for producing a rare earth element-containing alloy, including weighing raw materials to give a composition of $Ce(Co_{1-x}M_x)_4Sb_{12}$ (wherein M is at least one member selected from the group consisting of Cu, Zn and Mn), melting the raw materials in an inert gas atmosphere, and then quench-solidifying the melt.

(4-15) The process for producing a rare earth element-containing alloy as described in (4-14) above, in which the quench-solidification is performed by a strip casting method.

(4-16) The method for producing a rare earth element-containing alloy as described in (4-14) or (4-15), in which the cooling rate from 1,500° C. to 700° C. at the quench-solidification is from $10^2$ to $10^{3}$° C./sec.

(4-17) A thermoelectric conversion element comprising a combination of a rare earth element-containing alloy described in any one of (4-1) to (4-5) above and a rare earth element-containing alloy described in any one of (4-6) to (4-10) above.

According to the first aspect in the present invention, a thermoelectric conversion module and a thermoelectric power generating device each exhibiting high performance over a wide temperature range from a low temperature near room temperature to a high temperature region of 700° C. or more can be provided at a low cost. Also, a production method of a Heusler alloy or half Heusler alloy for the production of such a module or device can be provided.

According to the first aspect of the present invention, a trace element can be uniformly doped in the entire alloy or can be made to replace a specific site in the crystal structure, whereby replacement of a specific site is facilitated, for example, the V or Al site of Fe2VAl may be partially replaced by Ti or Si, respectively, or Ti or Sn of TiNiSn may be partially replaced by Zr or Sb, respectively.

According to the second aspect in the present invention, a high-efficiency thermoelectric conversion material can be produced at a low cost on an industrial scale, and a thermoelectric conversion element of practical level can be provided.

More specifically, according to the present invention, a nearly uniform filled skutterudite-based alloy can be easily and simply produced in a large amount by casting using a strip casting method.

The present invention is not only high in the industrial utility value due to use of La or Ce having little restraint in resources out of rare earth metals, but also effective in lightening the environmental load because of no use of Pb (lead), Te (tellurium) or the like. Also, the filled skutterudite-based alloy in the present invention exerts high performance in a high-temperature region of 300° C. or more and therefore, the power output is large. In addition, a quench-casting method capable of continuous production is employed and combined with a pressing-sintering technique, so that the element can be produced from an alloy comprising only a filled skutterudite phase which is a high-performance component, as a result, performance equal to or greater than that of conventional Pb—Te type elements can be achieved and both a high Seebeck coefficient and a low electrical resistance can be realized. Furthermore, by virtue of low thermal conductivity, the thermoelectric conversion module can be made compact.

The thermoelectric conversion module as a preferred embodiment in the present invention can be used in a high-temperature region up to 700° C. and therefore, when integrated into a waste heat utilizing system, the quantity of heat recovered by the heat exchanger can be increased and in turn, the quantity of unused heat can be decreased. That is, heat discarded so as to lower the operation temperature can be decreased and therefore, great elevation of the thermal conversion efficiency and remarkable increase of the power output can be realized.

Also, when integrated into a cogeneration system, unused heat (unnecessary warm water) can be converted into electricity and this leads to enhanced fuel efficiency and increased power output, so that the thermoelectric conversion module in the present invention can contribute to the elevation of power generation efficiency as a center part of a thermoelectric power generating module.

The high-performance thermoelectric element produced by the present invention can contribute to the elevation of power generation efficiency as a center part of a thermoelectric power generating module of converting heat into electricity by using, as the heat source, not only waste heat on a large scale including those in various industrial furnaces and incinerators but also unused waste heat on a small scale such as exhaust gas from various cogenerations, water heaters and automobiles, and natural energy (e.g., ground heat, solar heat), and this is a very effective measure against global warming.

According to the third aspect in the present invention, a nearly uniform filled skutterudite-based alloy can be easily and simply produced in a large amount by casting using a strip casting method. The filled skutterudite-based alloy produced by the production method in the present invention can be used as-is for a thermoelectric conversion element without passing through grinding and sintering steps and therefore, the production cost of the thermoelectric conversion element can be greatly decreased.

The present invention is not only high in the industrial utility value due to use of La having little restraint in resources out of rare earth metals but also effective in lightening the environmental load because of use of a metal free from a harmful substance (Pb (lead), Te (tellurium)) or the like. Also, the filled skutterudite-based alloy in the present invention exerts high performance in a high-temperature region of 300° C. or more and therefore, the power output is large. In addition, a quench-casting method capable of continuous production is employed and combined with a pressing-sintering technique, so that the element can be produced from an alloy comprising only a filled skutterudite phase which is a high-performance component, as a result, performance equal to or greater than that of conventional Pb—Te type elements can be achieved and both a high Seebeck coefficient and a low electrical resistance can be realized. Furthermore, by virtue of low thermal conductivity, the thermoelectric conversion module can be made compact.

The thermoelectric conversion module as a preferred embodiment in the present invention can be used in a high-temperature region up to 700° C. and therefore, when integrated into a waste heat utilizing system, the quantity of heat recovered by the heat exchanger can be increased and in turn, the quantity of unused heat can be decreased. That is, heat discarded so as to lower the operation temperature can be decreased and therefore, great elevation of the thermal conversion efficiency and remarkable increase of the power output can be realized.

Also, when integrated into a cogeneration system, unused heat (unnecessary warm water) can be converted into electricity and this leads to enhanced fuel efficiency and increased power output, so that the thermoelectric conversion module in the present invention can contribute to the elevation of power generation efficiency as a center part of a thermoelectric power generating module.

A production process established in the production of rare earth sintered magnets is employed, so that mass production at a low cost in an industrial scale can be facilitated as compared with conventional batch-type production systems.

The high-performance thermoelectric element produced by the present invention can contribute to the elevation of power generation efficiency as a center part of a thermoelectric power generating module of converting heat into electricity by using, as the heat source, not only waste heat on a large scale including those in various industrial furnaces and incinerators but also unused waste heat on a small scale such as exhaust gas from various cogenerations, water heaters and automobiles, and natural energy (e.g., ground heat, solar heat), and this is a very effective measure against global warming.

According to the fourth aspect in the present invention, a high-efficiency thermoelectric conversion material can be produced at a low cost, and a thermoelectric conversion element of practical level can be provided.

BEST MODE FOR CARRYING OUT THE INVENTION

Figure 1:
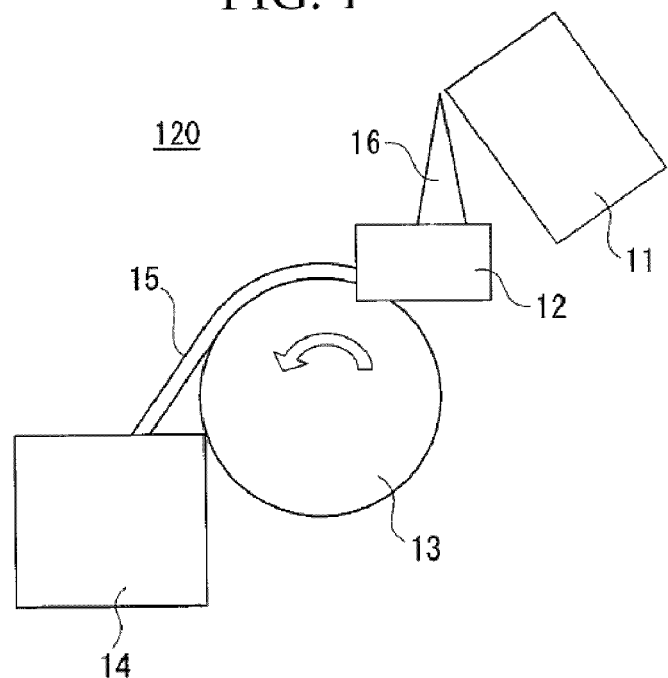
FIG. 1 is a schematic view showing a strip casting apparatus used for the production of alloy by quench-solidification.

The best mode for carrying out the present invention will be explained in detail below. It should be noted that the following mode may be combined with each other, if necessary.

The Heusler alloy according to the present invention is represented by the formula: $A_{3-x}B_xC$, wherein A and B each is a transition metal, C is a Group III or IV element, and the space group is Fm3m. The half Heusler alloy is represented by the formula: ABC, wherein A and B each is similarly a transition metal, C is a Group III or IV metal, and the space group is F43m.

The electrical properties and thermal properties of the Heusler alloy according to the present invention can be adjusted by adding, as an additive, B, C, Mg, Cu, Zn or a rare earth metal such as Y, La, Ce, Nd, Pr, Dy, Tb, Ga and Yb. In a preferred embodiment in the present invention, the ratio of strongest peak of the Heusler phase or half Heusler phase is preferably 85% or more, more preferably 90% or more. This peak ratio is defined by IHS/(IHS+IA+IB)×100(%) from a strongest peak (IHS) of the measured Heusler phase or half Heusler phase, a strongest peak intensity (IA) of an impurity phase A and a strongest peak intensity (IB) of an impurity phase B in the powder X-ray diffraction measurement.

When combining p-type and n-type thermoelectric semiconductors comprising the Heusler alloy in the present invention, these semiconductors may be electrically connected through an electrode or may be directly connected through an antidiffusion layer.

The crystal grain diameter of the thermoelectric semiconductor produced from the Heusler alloy is preferably smaller in view of reducing the thermal conductivity by the effect of lattice scattering, specifically, 100 μm or less, and from the standpoint of preventing abnormal grain growth due to excessive sintering, inhibiting dust explosion or enhancing powder-filling property, more preferably from 10 to 50 μm.

In grinding the Heusler alloy, the grinding method is not limited and known methods all can be employed but, for example, a ball mill, a pot mill, an attritor, a pin mill or a jet mill can be used.

The jet mill is preferred despite its relatively high grinding cost, because a continuous operation can be performed, a necessary measure for the prevention of oxidation or dust explosion can be easily taken, and even a fine powder of about 20 μm can be processed in a relatively short time.

The quench-solidified alloy obtained in the present invention has good grindability and therefore, a fine powder of 20 μm or less can be obtained in a shorter time at a high yield.

The shaping method of the alloy is not particularly limited, but when a powder of several μm obtained by pulverizing the alloy is shaped under a pressure of 0.5 to 5.0 t/cm² and the obtained green compact is sintered in an inert atmosphere at 1,100 to 1,400° C., a thermoelectric semiconductor element comprising fine crystal grains having a crystal grain diameter of 100 μm or less can be produced.

The powder produced from the alloy obtained as above already comprises only a Heusler or half Heusler phase and therefore, when shaped into a green compact by uniaxial shaping and sintered in an inert gas such as argon or in vacuum, a sintered body comprising a Heusler structure or a half Heusler phase can be easily produced. By processing such a sintered body into a predetermined shape and connecting p-type and n-type, a thermoelectric conversion module can be produced.

Figure 7:
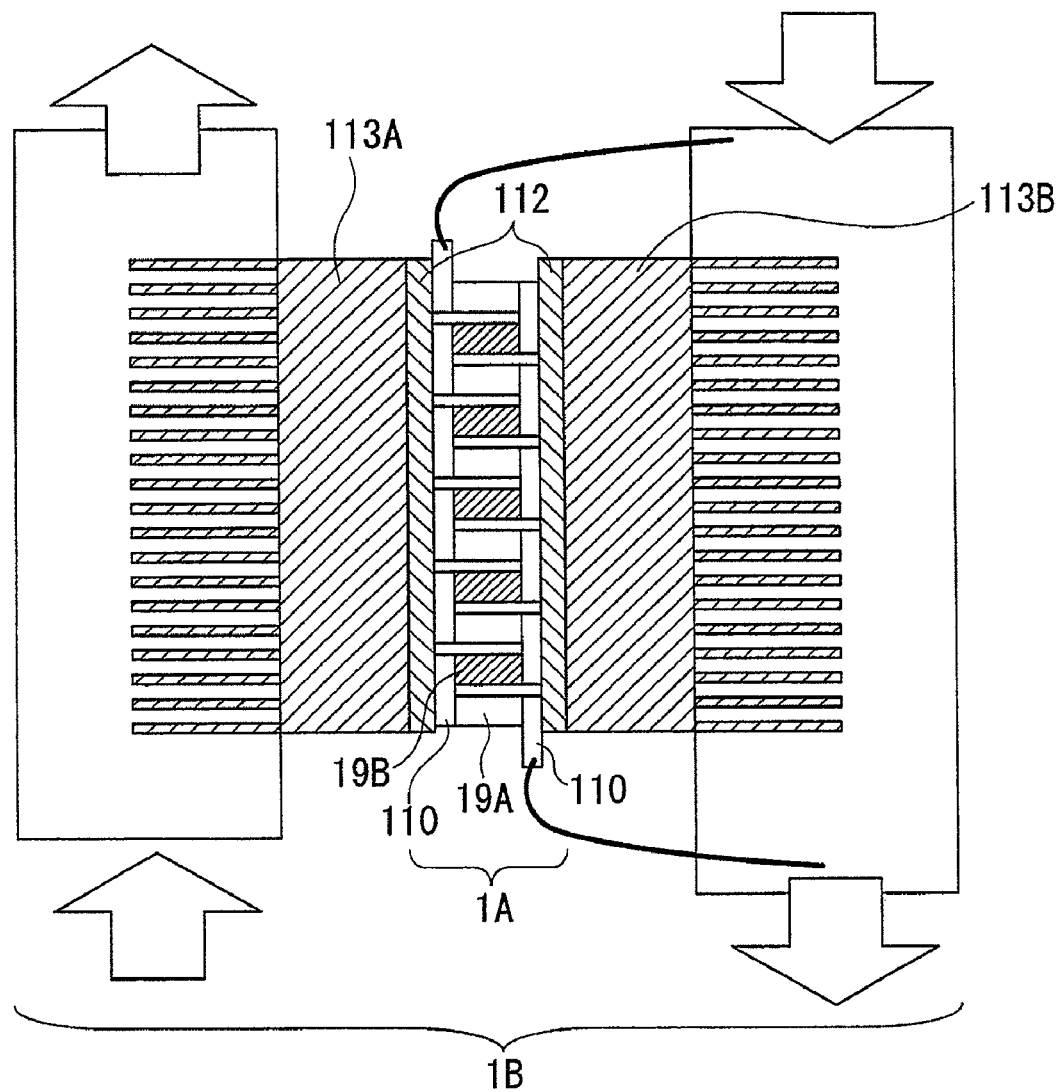
FIG. 7 is a plan view showing one example of the thermoelectric conversion module.

The thermoelectric conversion module 1A and thermoelectric power generating system, which are preferred embodiments in the present invention, are not particularly limited in their construction, but examples thereof include a thermoelectric conversion system 1B shown in FIG. 7. As shown in FIG. 7, a heat exchanger 113A or 113B such as heat sink is provided on both sides of a thermoelectric conversion module 1A to construct the system.

In the heat exchangers 113A and 113B, a plurality of fin materials are erected on one surface side of a substrate. In the case where the substrate is a metal plate, an insulating material 112 (insulating layer) is preferably disposed on the outer side surface of each electrode 110 or on the entire surface of the substrate so as to prevent a plurality of electrodes 110 of the thermoelectric conversion module 1A from shorting. When a DC current is passed to the thermoelectric conversion module group 1B in this mode, the temperature becomes low at one part and becomes high at another part and therefore, this can be used as a cooling/heating source or a thermoelectric power generating system.

The p-type semiconductor thermoelectric element 19A and n-type semiconductor thermoelectric element 19B constituting the thermoelectric device are electrically connected, for example, in series or in parallel to fabricate a thermoelectric conversion module 1A. The high-temperature contact side of the fabricated thermoelectric device is closely contacted with the heat exchanger 113A on the waste heat side through an insulator, and the low-temperature contact side of the thermoelectric device is closely contacted with the heat exchanger 113B on the cooling water side through an insulator.

In the thus-fabricated thermoelectric conversion system 1B, a temperature difference is generated in each of the p-type semiconductor thermoelectric element 19A and n-type semiconductor thermoelectric element 19B connected to the high-temperature contact side and low-temperature contact side, as a result, electricity according to the temperature difference based on the Seebeck effect is generated by thermoelectric conversion.

When the thermoelectric conversion system 1B produced by the present invention is employed, not only waste heat on a large scale including those in various industrial furnaces and incinerators but also waste heat such as exhaust gas from various cogenerations, water heaters and automobiles, and natural energy (e.g., ground heat, solar heat) can be utilized with high efficiency. Accordingly, the thermoelectric conversion module 1A in the present invention is suitable for waste heat recovery system, solar heat utilizing system and Peltier cooling/heating system.

The rare earth alloy in the present invention is $RE_x(Fe_{1-y}M_y)_4Sb_{12}$ (wherein RE is at least either one member of La and Ce, M is at least one member selected from the group consisting of Ti, Zr, Sn and Pb, $0<x\leq1$, and $0<y<1$). This alloy is suitably used as a p-type thermoelectric conversion material. The rare earth alloy in the present invention may contain therein unavoidable impurities such as Pb, As, Si, Al, Fe, Mo, W, C, O and N, and may take any shape of thin film, alloy and sintered body. The crystal structure is preferably a skutterudite-type crystal structure. In the rare earth alloy in the present invention, if x is less than 0.01, the thermal conductivity is deteriorated and the properties are impaired, and if y exceeds 0.15, this causes serious reduction in both the Seebeck coefficient and the electric conductivity. Therefore, y is preferably 0.15 or less. Also, if y is less than 0.01, the enhancement of performance obtainable by the addition is insufficient. Therefore, y is preferably 0.01 or more. When M is added within this range, the Seebeck coefficient and the electric conductivity both can be enhanced.

In another embodiment, the rare earth alloy in the present invention is $RE_x(Co_{1-y}M_y)_4Sb_{12}$ (wherein RE is at least either one member of La and Ce, M is at least one member selected from the group consisting of Ti, Zr, Sn and Pb, $0<x\leq1$ and $0<y<1$). This alloy is suitably used as an n-type thermoelectric conversion material. This rare earth alloy may contain therein unavoidable impurities such as Pb, As, Si, Al, Fe, Mo, W, C, O and N, and may be in any shape of thin film, alloy and sintered body. The crystal structure is preferably a skutterudite-type crystal structure. In this rare earth alloy, if x is less than 0.01, the thermal conductivity is deteriorated and the properties are impaired, and if y exceeds 0.15, this causes serious reduction in both the Seebeck coefficient and the electric conductivity. Therefore, y is preferably 0.15 or less. Also, if y is less than 0.01, the enhancement of performance obtainable by the addition is insufficient. Therefore, y is preferably 0.01 or more. When M is added within this range, mainly the Seebeck coefficient and in turn the performance can be enhanced.

The rare earth alloy in the present invention can be produced by weighing raw materials to give a composition of $RE_x(Fe_{1-y}M_y)_4Sb_{12}$ (wherein RE is at least either one member of La and Ce, M is at least one member selected from the group consisting of Ti, Zr, Sn and Pb, $0<x\leq1$, and $0<y<1$), melting the raw materials in an inert gas atmosphere, and then quench-solidifying the melt.

The rare earth alloy in the present invention can also be produced by weighing raw materials to give a composition of $RE_x(Co_{1-y}M_y)_4Sb_{12}$ (wherein RE is at least either one member of La and Ce, M is at least one member selected from the group consisting of Ti, Zr, Sn and Pb, $0<x\leq1$, and $0<y<1$), melting the raw materials in an inert gas atmosphere, and then quench-solidifying the melt.

For the quenching in these two processes, a strip casting method shown in FIG. 1 or a method known as a quenching method for molten metals can be used. The cooling rate is, in the range from 1,400 to 800° C., preferably $1\times10^{2}$° C./sec or more, more preferably from $1\times10^2$ to $1\times10^{4}$° C./sec, still more preferably from $2\times10^2$ to $1\times10^{3}$° C./sec. If the cooling rate is less than $1\times10^{2}$° C./sec, the phases are separated and the components greatly fluctuate by the grinding, whereas if it exceeds $1\times10^{4}$° C., the phase becomes amorphous and the grinding rate disadvantageously decreases.

When the above-described quenching method is employed, the average thickness of the alloy flake becomes approximately from 0.1 to 2 mm, preferably on the order of 0.2 to 0.4 mm. By employing a most preferred quenching rate, an average thickness on the order of 0.25 to 0.35 mm is obtained.

When the p-type and n-type thermoelectric conversion materials using the rare earth alloys in the present invention are combined and contacted, for example, in a horseshoe shape to form a p-n junction element, a high-efficiency thermoelectric conversion element can be produced. Also, a thermoelectric conversion element advantageous in view of cost and resources as compared with conventional thermoelectric conversion elements can be produced.

Figure 8:
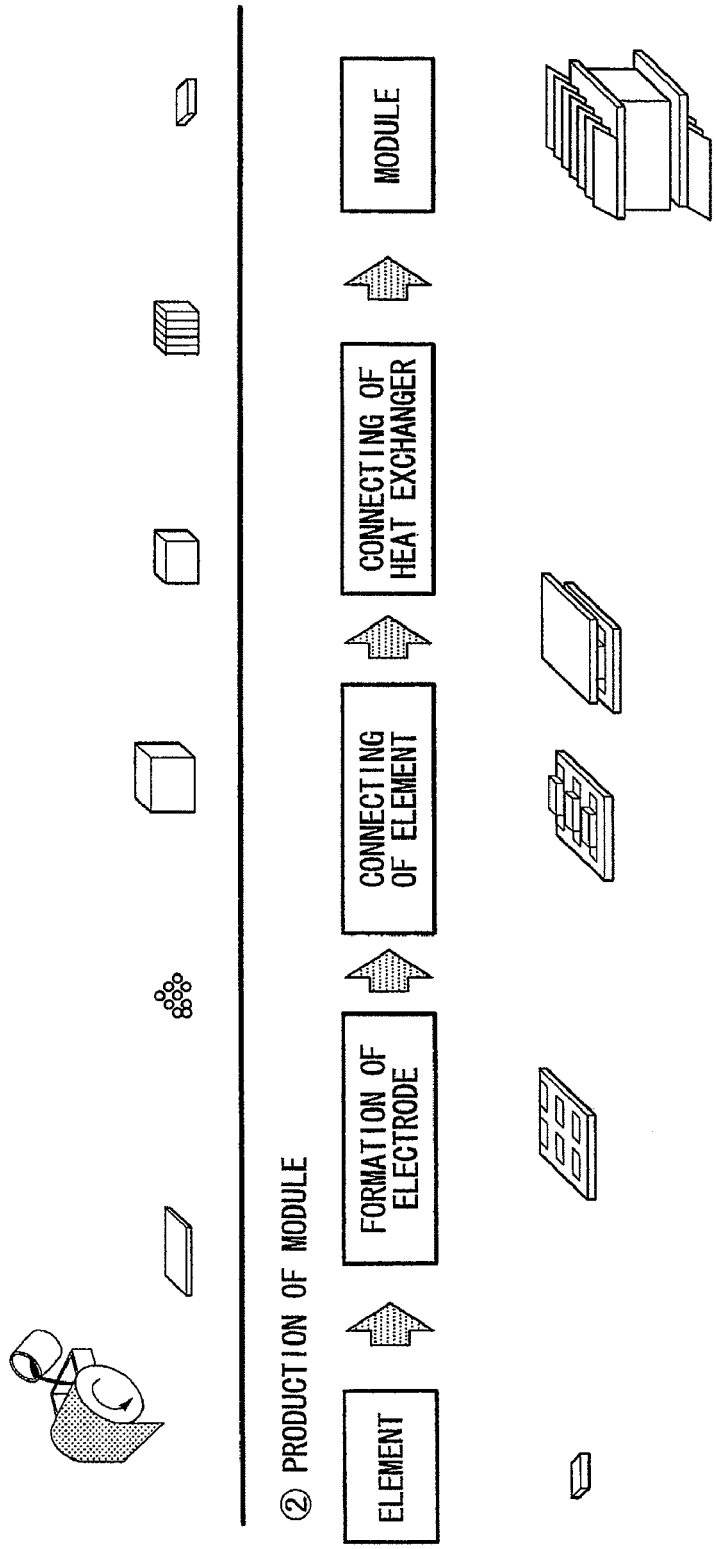
FIG. 8 is a view showing one example of the process for producing thermoelectric element and module for the generation of heat.

FIG. 8 shows the process of producing the thermoelectric conversion element and module in the present invention.

The thermoelectric conversion module and thermoelectric conversion system produced from the thermoelectric conversion element which is a preferred embodiment in the present invention are not particularly limited in their construction but, for example, a system shown in FIG. 7 may be fabricated. The p-type thermoelectric conversion element and n-type thermoelectric conversion element constituting the thermoelectric conversion device are electrically connected, for example, in series or in parallel to fabricate a thermoelectric conversion module. The high-temperature contact side of the fabricated thermoelectric conversion device is closely contacted with the heat exchanger on the waste heat side through an insulator, and the low-temperature contact side of the thermoelectric conversion device is closely contacted with the heat exchanger on the cooling water side through an insulator.

In the thus-fabricated thermoelectric conversion system, a temperature difference is generated in each of the p-type thermoelectric conversion element and n-type thermoelectric conversion element connected to the high-temperature contact side and low-temperature contact side, as a result, electricity according to the temperature difference based on the Seebeck effect is generated by thermoelectric conversion.

When the thermoelectric conversion system produced by the present invention is employed, not only waste heat on a large scale including those in various industrial furnaces and incinerators but also waste heat such as exhaust gas from various cogenerations, water heaters and automobiles, and natural energy (e.g., ground heat, solar heat) can be utilized with high efficiency.

The filled skutterudite-based alloy for use in the present invention is an alloy represented by the formula: $RT_4Sb_{12}$ (wherein R is at least one member selected from La, Ce, Pr, Nd, Sm, Eu and Yb, and T is at least one member selected from Fe, Co, Ni, Os, Ru, Pd, Pt and Ag), where a filled skutterudite phase occupies 95% or more by volume. A part of Sb may be replaced by As or P.

With respect to the raw materials which can be used for the filled skutterudite-based alloy in the present invention, the rare earth metal R may be a rare earth metal (purity: 90 mass % or more, balance of unavoidable impurities such as Al, Fe, Mo, W, C, O and N), a mischmetal (rare earth metal component: 90 mass % or more, balance of unavoidable impurities such as Al, Fe, Mo, W, C, O and N) or the like. The transition metal T may be a pure iron (purity: 99 mass % or more), a metal such as Co and Ni (purity: 99 mass % or more), or the like. The Sb may be a metal antimony (purity: 95 mass % or more, balance of unavoidable impurities such as Pb, As, Fe, Cu, Bi, Ni, C, O and N). The raw materials for the filled skutterudite-based alloy in the present invention are prepared by weighing the above-described raw materials of R, T and metal antimony to give an alloy composition of $RT_4Sb_{12}$. For producing the alloy in the present invention, the compositional ratio of raw materials is preferably such that R is from 7.5 to 8.3 mass %, T is from 12.1 to 12.3 mass %, and Sb is from 79.5 to 80.2 mass %.

In the present invention, the filled skutterudite-based alloy is produced by the strip casting method (SC method). FIG. 1 shows a production apparatus employing the SC method, which is used for the production of the alloy. In FIG. 1, 11 is a crucible, 12 is a tundish, 13 is a copper roll, 14 is a container, 16 is a molten metal, and 15 is a solidified alloy flake.

In the production method of the filled skutterudite-based alloy for use in the present invention, the alloy raw materials prepared as above are melted in the crucible 11 at a temperature of 800 to 1,800° C. in an inert gas atmosphere such as Ar and He. At this time, the pressure in the atmosphere is preferably set to from atmospheric pressure (0.1 MPa) to 0.2 MPa, because the amount of Sb evaporated can be suppressed.

The molten metal 16 resulting from melting the alloy raw materials is passed through the tundish 12 and poured on the water-cooled copper roll 13 rotating in the arrow direction of FIG. 1, thereby effecting quench-solidification. At this time, the cooling rate is, in the range from the temperature of the molten metal to 800° C., preferably from $10^2$ to $10^{4}$° C./sec so as to obtain a uniform alloy structure comprising a filled skutterudite phase. The cooling rate is more preferably from $5\times10^2$ to $3\times10^{3}$° C./sec. The cooling rate of the molten alloy can be controlled to a desired value by controlling the peripheral velocity of the copper roll 13 or the amount of the molten metal poured on the copper roll 13.

The alloy resulting from solidification of the molten metal is separated from the copper roll 13, and the obtained alloy flake 15 is accumulated in the recovery box 14, cooled to room temperature in the recovery box 14 and then taken out. At this time, when the recovery box 14 is thermally insulated or enforcedly cooled, the cooling rate of the alloy flake after solidification can be controlled. By controlling the cooling rate of the alloy flake after solidification in this way, the uniformity of the filled skutterudite phase in the alloy can be more enhanced.

In the present invention, the thickness of the filled skutterudite-based alloy flake produced by the SC method is preferably set to 0.1 to 2 mm. By setting the thickness of the alloy flake to 0.1 to 2 mm, a filled skutterudite-based alloy having a sufficiently high mechanical strength and facilitating the processing in use for a thermoelectric conversion element can be obtained.

In the thus-produced skutterudite-based alloy for use in the present invention, when the produced phases are identified by the powder X-ray diffraction method, the intensity ratio of the strongest peak of the filled skutterudite phase is 95% or more in the as-taken out state from the production apparatus of SC method even without newly applying a heat treatment. One example of the produced phases of the filled skutterudite-based alloy for use in the present invention as identified by the powder X-ray diffraction method is shown in FIG. 9.

Figure 9:
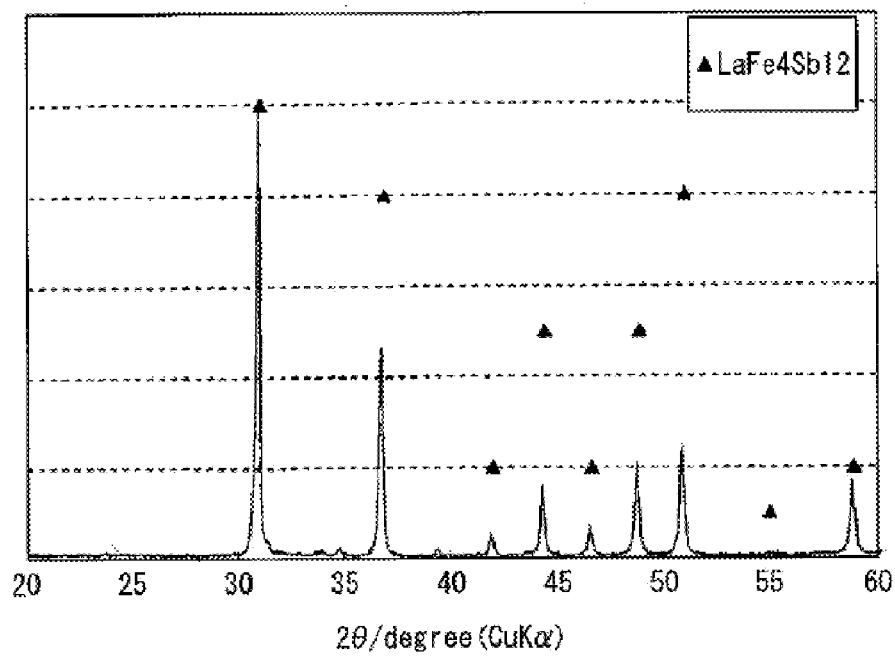
FIG. 9 is an X-ray diffraction pattern of the $LaFe_4Sb_{12}$ filled skutterudite alloy obtained by the present invention.

FIG. 9 is a view showing the results of X-ray diffraction measurement when the alloy in the as-taken out state from the production apparatus of SC method is ground and measured. The integrated intensity of peaks showing the highest intensity of the filled skutterudite phase and the integrated intensities of peaks showing the highest intensities of other phases such as $Sb_2Fe$ and Sb are calculated, and the ratio of the filled skutterudite phase to the total of other phases is calculated, whereby the abundance ratio of the filled skutterudite phase can be determined. For example, in the X-ray diffraction pattern shown in FIG. 9, the abundance ratio of the filled skutterudite phase is 99 mass % or more.

In the filled skutterudite-based alloy produced as above for use in the present invention, the filled skutterudite phase occupies 95% or more by volume, and the ratio of phases other than the filled skutterudite phase is 5% or less by volume. Here, the phase other than the filled skutterudite phase is, for example, phases of $Sb_2Fe$ and Sb. Also, in the alloy for use in the present invention, the maximum diameter of phases other than the filled skutterudite phase is 10 μm or less.

Figure 10:
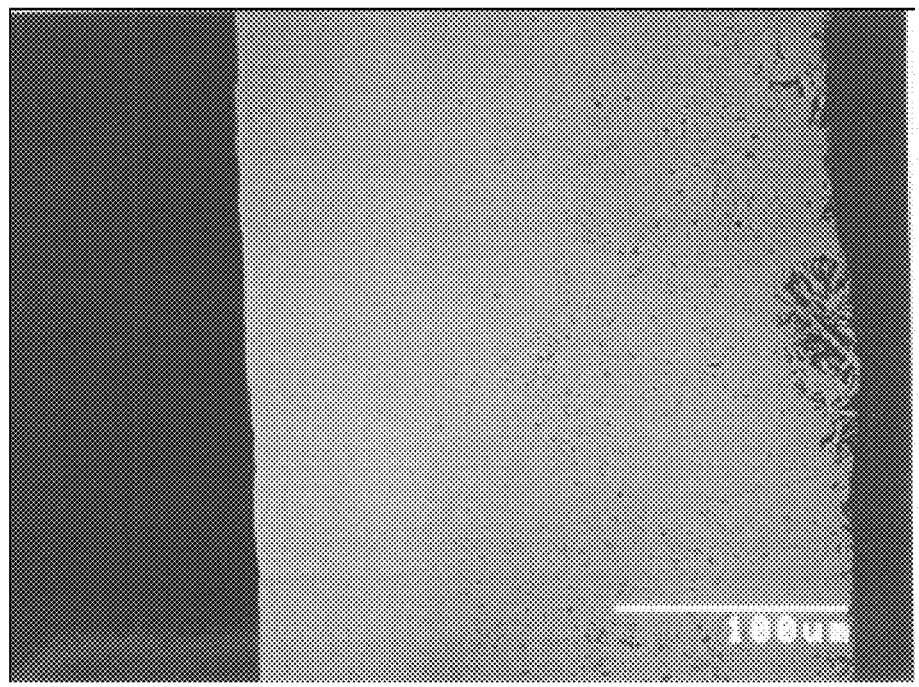
FIG. 10 is a backscattered electron image of the cross section of the $LaFe_4Sb_{12}$ filled skutterudite alloy obtained by the present invention.
Figure 11:
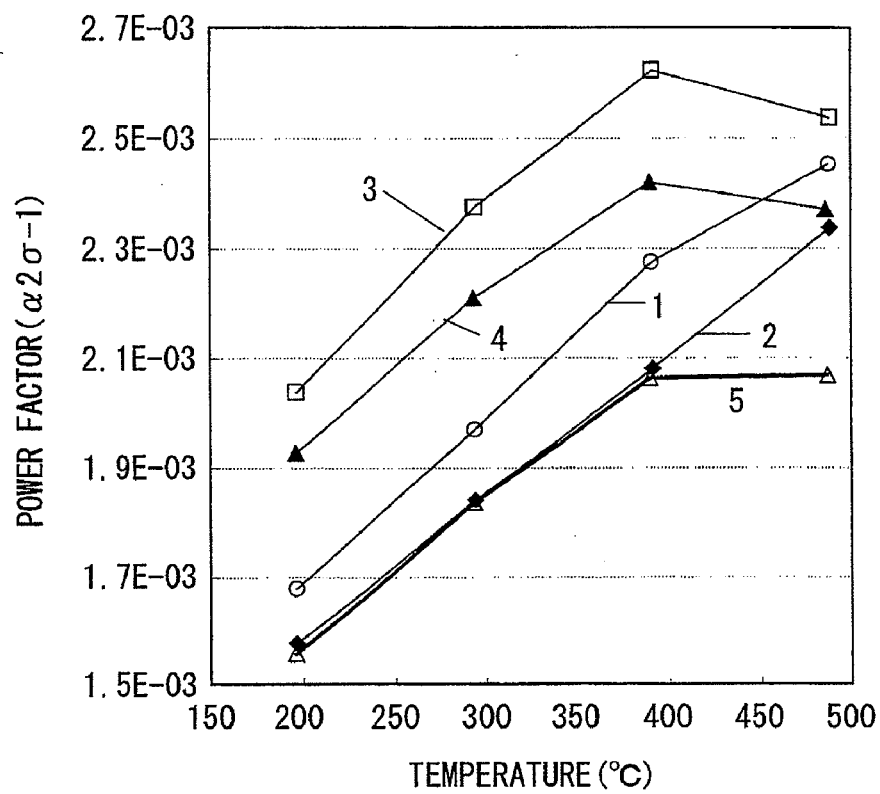
FIG. 11 is a graph showing the relationship between the power factor and the temperature of the p-type $La(Fe_{1-x}M_x)_4Sb_{12}$ filled skutterudite thermoelectric conversion element obtained by the present invention.
Figure 12:
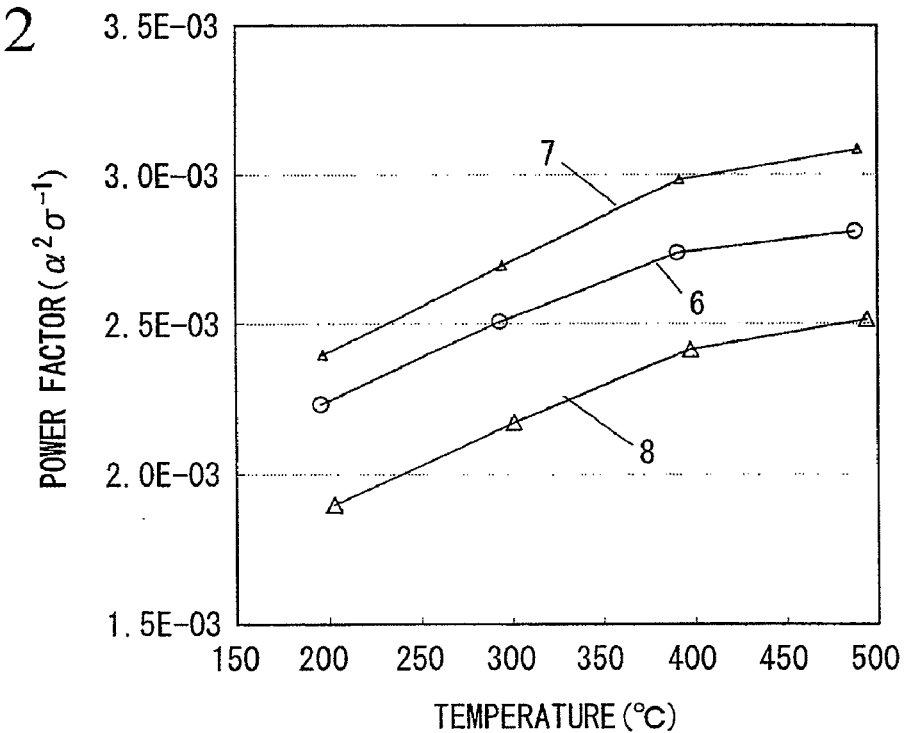
FIG. 12 is a graph showing the relationship between the power factor and the temperature of the n-type $Ce(Co_{1-x}M_x)_4Sb_{12}$ filled skutterudite thermoelectric conversion element obtained by the present invention.

The volume ratio of the filled skutterudite phase to phases other than the filled skutterudite phase in the alloy can be determined by calculating the area ratio of the region having a contrast differing from the filled skutterudite phase in a backscattered electron image through a scanning electron microscope, and calculating the volume ratio from the obtained value. By using the backscattered electron image, the maximum diameter of phases other than the filled skutterudite phase can also be determined. FIG. 10 shows one example of the backscattered electron image by a scanning electron microscope of the filled skutterudite-base alloy for use in the present invention. It is seen that the alloy comprises a nearly uniform filled skutterudite phase, the volume ratio is 95 vol % or more, and the maximum diameter of phases other than the filled skutterudite phase is 10 μm or less.

The filled skutterudite-based alloy in the present invention is produced through melting and casting in an inert gas atmosphere and therefore, the total of oxygen, nitrogen and carbon contents can be made to 0.2 mass % or less.

In the case of producing a thermoelectric conversion element, the filled skutterudite-based alloy obtained in the present invention can be suitably used as a p-type material. As for the n-type material, an existing substance other than the filled skutterudite-based alloy, such as Pb—Te-based material, can be used. When these p-type and n-type thermoelectric conversion materials are joined directly or indirectly through a metal conductor to create p-n junction, a thermoelectric conversion element can be produced. In the case of producing a thermoelectric element module, these materials can be used in combination with a Bi—Te-based material or Se-based compound having excellent low-temperature properties and a Co oxide-based compound having excellent high-temperature properties.

The production method of the thermoelectric conversion element is not particularly limited but, for example, the production process shown in FIG. 8 can be employed.

The thermoelectric conversion module and thermoelectric conversion system produced from the thermoelectric conversion element which is a preferred embodiment in the present invention are not particularly limited in their construction but, for example, a system shown in FIG. 7 may be fabricated. The p-type semiconductor and n-type semiconductor constituting the thermoelectric conversion device are electrically connected, for example, in series or in parallel to fabricate a thermoelectric conversion module. The high-temperature contact side of the fabricated thermoelectric conversion device is closely contacted with the heat exchanger on the waste heat side through an insulator, and the low-temperature contact side of the thermoelectric conversion device is closely contacted with the heat exchanger on the cooling water side through an insulator.

In the thus-fabricated thermoelectric conversion system, a temperature difference is generated in each of the p-type semiconductor and n-type semiconductor connected to the high-temperature contact side and low-temperature contact side, as a result, electricity according to the temperature difference based on the Seebeck effect is generated by thermoelectric conversion.

When the thermoelectric conversion system produced by the present invention is employed, not only waste heat on a large scale including those in various industrial furnaces and incinerators but also waste heat such as exhaust gas from various cogenerations, water heaters and automobiles, and natural energy (e.g., ground heat, solar heat) can be utilized with high efficiency.

The rare earth-containing alloy in the present invention is $La(Fe_{1-x}M_x)_4Sb_{12}$, wherein M is at least one member selected from Ti, Zr, Sn and Pb, and x is $0<x<1$, preferably $0.01 \leq x \leq 0.15$. This alloy is suitably used as a p-type thermoelectric conversion material. The rare earth-containing alloy in the present invention may contain therein unavoidable impurities such as Pb, As, Si, Al, Fe, Mo, W, C, O and N, and may take any shape of thin film, alloy and sintered body. The crystal structure may be a skutterudite-type crystal structure but is preferably a filled skutterudite-type crystal structure. In the rare earth-containing alloy in the present invention, if x exceeds 0.15, this causes serious reduction in both the Seebeck coefficient and the electric conductivity. Therefore, x is preferably 0.15 or less. When M is added within this range, the Seebeck coefficient and the electric conductivity both can be enhanced.

In another embodiment, the rare earth-containing alloy in the present invention is $Ce(Co_{1-x}M_x)_4Sb_{12}$, wherein M is at least one member selected from Cu, Zn and Mn, and x is $0<x<1$, preferably from 0.01 to 0.15. This alloy is suitably used as an n-type thermoelectric conversion material. This rare earth-containing alloy may contain therein unavoidable impurities such as Pb, As, Si, Al, Fe, Mo, W, C, O and N, and may take any shape of thin film, alloy and sintered body. The crystal structure may be a skutterudite-type crystal structure but is preferably a filled skutterudite-type crystal structure. In this rare earth-containing alloy, if x exceeds 0.15, this causes serious reduction in both the Seebeck coefficient and the electric conductivity. Therefore, x is preferably 0.15 or less. When M is added within this range, mainly the Seebeck coefficient and in turn the performance can be enhanced.

The rare earth-containing alloy in the present invention can be produced by weighing raw materials to give a composition of $La(Fe_{1-x}M_x)_4Sb_{12}$ (wherein M is at least one member selected from the group consisting of Ti, Zr, Sn and Pb), melting the raw materials in an inert gas atmosphere, and then quench-solidifying the melt.

The rare earth alloy in the present invention can also be produced by weighing raw materials to give a composition of $Ce(Co_{1-x}M_x)_4Sb_{12}$ (wherein M is at least one member selected from the group consisting of Cu, Zn and Mn), melting the raw materials in an inert gas atmosphere, and then quench-solidifying the melt.

For the quenching in these two methods, a strip casting method shown in FIG. 1 or a method known as a quenching method for molten metals can be used. The cooling rate from 1,500 to 700° C. is preferably $10^2$ to $10^{3°}$ C./sec.

When the p-type and n-type thermoelectric conversion materials using the rare earth-containing alloys in the present invention are combined and contacted, for example, in a horseshoe shape to form a p-n junction element, a high-efficiency thermoelectric conversion element can be produced. Also, a thermoelectric conversion element advantageous in view of cost and resources as compared with conventional thermoelectric conversion elements can be produced.

The present invention is described in greater detail below by referring to Examples, but the present invention is not limited to these Examples.

EXAMPLE 1

Sponge Ti (purity: 99 mass % or more), sponge Zr (purity: 99 mass % or more), electrolytic Ni (purity: 99 mass % or more) and Sn metal (purity: 99.9 mass % or more) were weighed to give a half Heusler-type $(Ti_xZr_{1-x})NiSn$ composition after casting, and high-frequency melted at a temperature up to 1,700° C. under 0.1 MPa in an Ar atmosphere. Thereafter, by using a strip casting apparatus 120 shown in FIG. 1, the molten metal was poured from the crucible 11 through the tundish 12 on the water-cooled copper roll 13 rotating at a spherical velocity of 0.9 m/sec to produce an alloy flake 15, and the alloy flake was recovered in the recovery box 14. The average thickness of the alloy flake 15 was 0.25 mm. In this casting, the cooling rate was estimated to be about $7 \times 10^{2°}$ C./sec.

Figure 2:
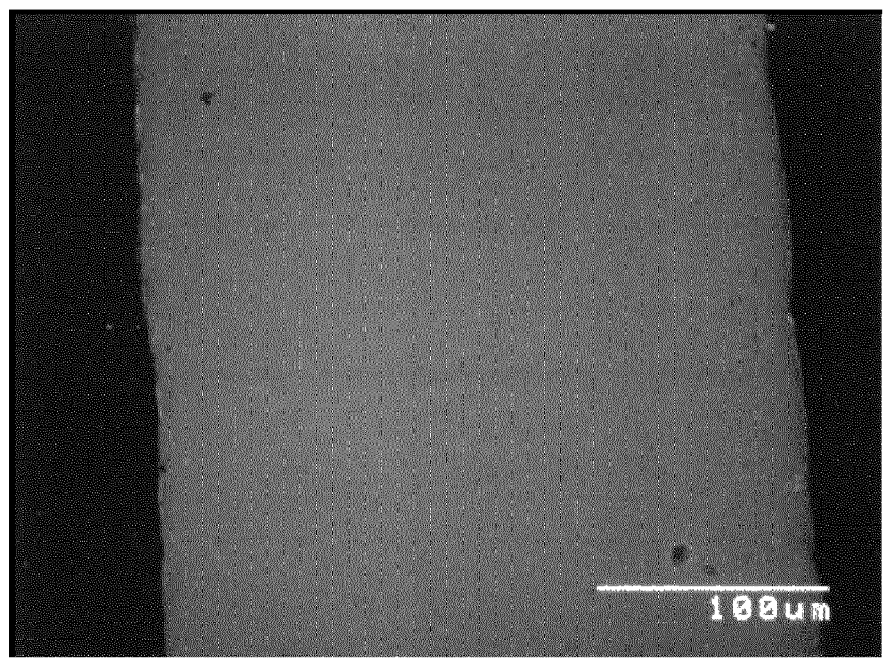
FIG. 2 is a backscattered electron image of quench-solidified TiNiSn alloy.
Figure 3:
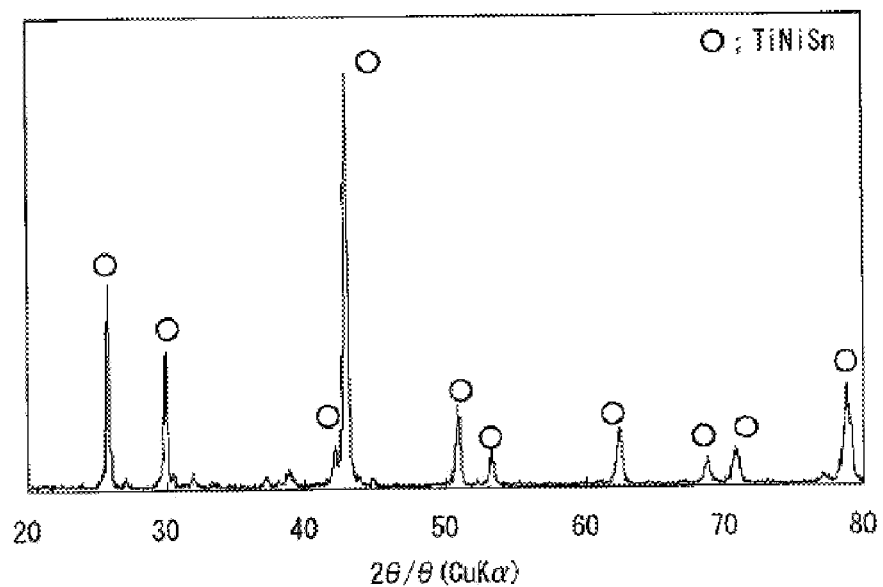
FIG. 3 is an X-ray diffraction pattern of quench-solidified TiNiSn alloy.

FIG. 2 is a reflection electron microphotograph showing the cross section of the alloy obtained as above. As seen from this, the alloy flake has a uniform structure in the entire region. Also, it is known from the X-ray diffraction pattern of FIG. 3 that the structure is a half Heusler structure. The ratio of strongest peak of the TiNiSn half Heusler phase was 100%.

This alloy was ground to 200 μm or less by a disc mill and then pulverized at 0.5 MPa in a nitrogen steam by a jet mill, NPK-100NP™ manufactured by Nippon Pneumatic Mfg. Co., Ltd. The average particle size d50 of the obtained powder was 3.0 μm. The yield of the powder was 80% based on the amount charged.

The obtained powder was shaped into a size of 15 mm×15 mm×30 mm under a shaping pressure of 1.0 t/cm² by a shaping machine in a glove box controlled to an oxygen concentration of 300 ppm or less, and then kept at 1,200° C. for 3 hours in vacuum, thereby obtaining a sintered body.

A block of 4 mm×4 mm×15 mm was cut out from the sintered body and measured for the Seebeck coefficient α,
electric conductivity ρ and power factor $Pf=\alpha^2/\rho$ at 200 to 500° C. by using a thermoelectric property evaluating apparatus, ZEM-2™ manufactured by ULVAC, Inc. These measurement results are shown in Table 1.

TABLE 1

Thermoelectric Properties of Heusler Element Fe—V—Al

| Type | Sample | Temperature of Sample | Resistivity (σ = Ω · m) | Seebeck Coefficient (α = V/° C.) | Power Factor ($\alpha^2\sigma^{-1}$) |
|---|---|---|---|---|---|
| n | $Fe_2V(Al_{0.8}Si_{0.2})$ | 53.6 | 2.40E−06 | −9.71E−05 | 3.94E−03 |
|   |   | 101.0 | 2.68E−06 | −9.84E−05 | 3.61E−03 |
|   |   | 198.9 | 3.16E−06 | −9.63E−05 | 2.93E−03 |
|   |   | 297.2 | 3.40E−06 | −7.87E−05 | 1.82E−03 |
|   |   | 395.3 | 3.43E−06 | −5.99E−05 | 1.05E−03 |
|   | $Fe_2V(Al_{0.8}Si_{0.2})$ | 54.6 | 2.36E−06 | −9.99E−05 | 4.23E−03 |
|   |   | 100.9 | 2.62E−06 | −1.02E−04 | 4.00E−03 |
|   |   | 198.6 | 3.08E−06 | −9.79E−05 | 3.11E−03 |
|   |   | 296.8 | 3.32E−06 | −7.94E−05 | 1.90E−03 |
|   |   | 395.0 | 3.34E−06 | −6.07E−05 | 1.10E−03 |
|   | $Fe_2V(Al_{0.9}Si_{0.1})$ | 54.2 | 3.89E−06 | −1.18E−04 | 3.58E−03 |
|   |   | 101.7 | 4.20E−06 | −1.11E−04 | 2.95E−03 |
|   |   | 200.0 | 4.47E−06 | −8.92E−05 | 1.78E−03 |
|   |   | 298.8 | 4.33E−06 | −8.15E−05 | 8.72E−04 |
|   |   | 397.1 | 4.09E−06 | −4.19E−05 | 4.30E−04 |
|   | $Fe_2V(Al_{0.9}Si_{0.1})$ | 55.2 | 3.77E−06 | −1.18E−04 | 3.71E−03 |
|   |   | 101.0 | 4.03E−06 | −1.12E−04 | 3.10E−03 |
|   |   | 198.6 | 4.28E−06 | −9.10E−05 | 1.93E−03 |
|   |   | 296.9 | 4.16E−06 | −6.27E−05 | 9.45E−04 |
|   |   | 395.0 | 3.92E−06 | −4.32E−05 | 4.76E−04 |
|   | $Fe_2VAl$ | 54.3 | 9.02E−06 | −6.02E−05 | 4.02E−04 |
|   |   | 100.8 | 7.72E−06 | −4.34E−05 | 2.44E−04 |
|   |   | 197.5 | 5.81E−06 | −2.44E−05 | 1.03E−04 |
|   |   | 295.0 | 4.72E−06 | −1.57E−05 | 5.24E−05 |
|   |   | 392.5 | 4.11E−06 | −1.31E−05 | 4.16E−05 |
|   |   | 489.9 | 3.75E−06 | −1.25E−05 | 4.18E−05 |
|   | $Fe_2VAl$ | 54.6 | 9.21E−06 | −5.97E−05 | 3.87E−04 |
|   |   | 101.2 | 7.82E−06 | −4.31E−05 | 2.38E−04 |
|   |   | 198.2 | 5.80E−06 | −2.40E−05 | 9.95E−05 |
|   |   | 295.8 | 4.68E−06 | −1.57E−05 | 5.26E−05 |
|   |   | 393.2 | 4.07E−06 | −1.30E−05 | 4.15E−05 |
|   |   | 490.7 | 3.71E−06 | −1.29E−05 | 4.46E−05 |
| p | $Fe_2(V_{0.9}Ti_{0.1})Al$ | 55.1 | 2.33E−06 | 7.01E−05 | 2.11E−03 |
|   |   | 101.9 | 2.55E−06 | 7.29E−05 | 2.09E−03 |
|   |   | 199.9 | 2.94E−06 | 7.27E−05 | 1.80E−03 |
|   |   | 298.4 | 3.11E−06 | 5.58E−05 | 1.00E−03 |
|   |   | 396.6 | 3.12E−06 | 3.53E−05 | 3.99E−04 |
|   | $Fe_2(V_{0.97}Ti_{0.03})Al$ | 54.8 | 7.43E−06 | 6.74E−05 | 6.11E−04 |
|   |   | 101.5 | 6.69E−06 | 5.74E−05 | 4.92E−04 |
|   |   | 199.4 | 5.40E−06 | 3.63E−05 | 2.43E−04 |
|   |   | 297.9 | 4.57E−06 | 1.88E−05 | 7.73E−05 |
|   |   | 396.0 | 4.12E−06 | 7.53E−06 | 1.38E−05 |
|   |   | 494.0 | 3.84E−06 | 3.83E−07 | 3.81E−08 |
|   | $Fe_2(V_{0.97}Ti_{0.03})Al$ | 54.9 | 9.28E−06 | 7.89E−05 | 6.70E−04 |
|   |   | 101.2 | 8.51E−06 | 6.90E−05 | 5.59E−04 |
|   |   | 198.8 | 6.95E−06 | 4.47E−05 | 2.87E−04 |
|   |   | 297.1 | 5.88E−06 | 2.42E−05 | 9.99E−05 |
|   |   | 395.2 | 5.29E−06 | 1.08E−05 | 2.21E−05 |

COMPARATIVE EXAMPLE 1

Sponge Ti (purity: 99 mass % or more), sponge Zr (purity: 99 mass % or more), electrolytic Ni (purity: 99 mass % or more) and Sn metal (purity: 99.9 mass % or more) were weighed to give a half Heusler-type $(Ti_xZr_{1-x})NiSn$ composition after casting, and high-frequency melted at a temperature up to 1,700° C. under 0.1 MPa in an Ar atmosphere. Thereafter, the alloy was solidified by using a cast iron mold in a width of 20 mm. The cooling rate at this time was estimated to be about $1 \times 10^{2°}$ C./sec.

Figure 4:
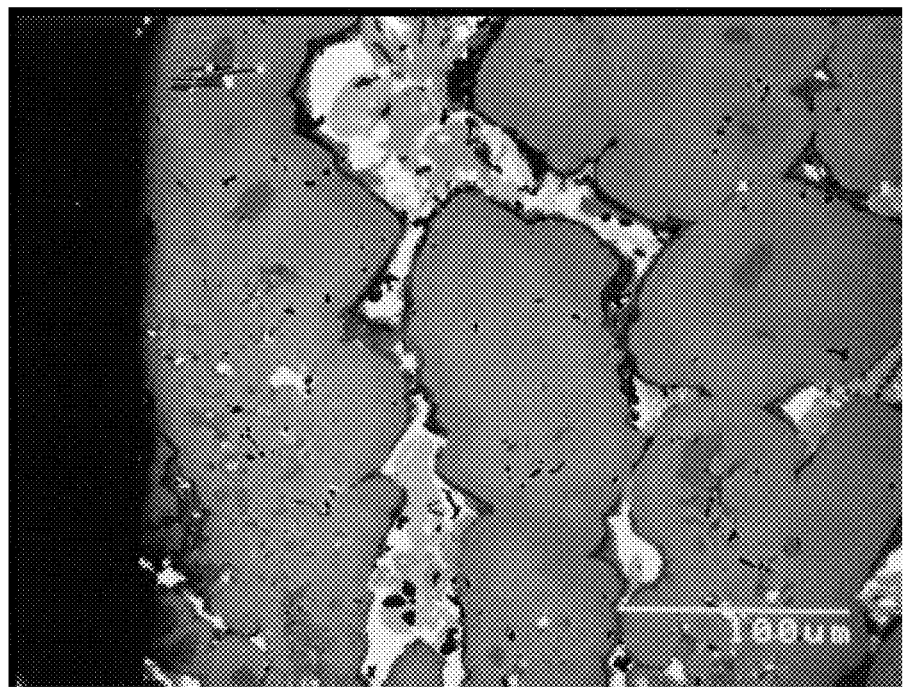
FIG. 4 is a backscattered electron image of normally cooled TiNiSn alloy.

FIG. 4 is a reflection electron microphotograph showing the cross section of the alloy obtained as above. As seen from this, a plurality of phases non-uniformly are present in the alloy. The ratio of strongest peak of the half Heusler phase was 80%.

A block of 4 mm×4 mm×15 mm was cut out from the alloy flake after casting and measured for the Seebeck coefficient α, electric conductivity ρ and power factor Pf=α²/ρ at 200 to 500° C. by using a thermoelectric property evaluating apparatus, ZEM-2™ manufactured by ULVAC, Inc. These measurement results are shown in Table 2. As seen from these results, the performance was apparently decreased as compared with Example 1.

TABLE 2

Thermoelectric Properties of Half Heusler Element Ti—Ni—Sn

| Type | Sample | Temperature of Sample | Resistivity ($\sigma = \Omega \cdot m$) | Seebeck Coefficient ($\alpha = V/°C.$) | Power Factor ($\alpha^2 \sigma^{-1}$) |
|---|---|---|---|---|---|
| N | $(Ti_{0.5}Zr_{0.5})$ $NiSn_{0.998}Sb_{0.002}$ | 198.1 | 1.41E−05 | −2.10E−04 | 3.14E−03 |
|   |   | 296.4 | 1.42E−05 | −2.16E−04 | 3.29E−03 |
|   |   | 394.5 | 1.37E−05 | −2.17E−04 | 3.43E−03 |
|   |   | 492.5 | 1.32E−05 | −2.12E−04 | 3.41E−03 |
|   | $(Ti_{0.5}Zr_{0.5})$ $NiSn_{0.998}Sb_{0.002}$ | 198.5 | 1.43E−05 | −2.11E−04 | 3.11E−03 |
|   |   | 296.8 | 1.44E−05 | −2.17E−04 | 3.26E−03 |
|   |   | 394.9 | 1.39E−05 | −2.15E−04 | 3.35E−03 |
|   |   | 492.9 | 1.33E−05 | −2.12E−04 | 3.36E−03 |
|   | $(Ti_{0.5}Zr_{0.5})$ $NiSn_{0.998}Sb_{0.002}$ | 198.0 | 1.37E−05 | −2.07E−04 | 3.14E−03 |
|   |   | 296.4 | 1.37E−05 | −2.14E−04 | 3.32E−03 |
|   |   | 394.5 | 1.32E−05 | −2.14E−04 | 3.47E−03 |
|   |   | 492.4 | 1.27E−05 | −2.11E−04 | 3.49E−03 |
|   | $(Ti_{0.5}Zr_{0.5})NiSn$ | 198.3 | 1.67E−05 | −1.92E−04 | 2.20E−03 |
|   |   | 296.5 | 1.62E−05 | −2.01E−04 | 2.49E−03 |
|   |   | 394.5 | 1.49E−05 | −2.04E−04 | 2.78E−03 |
|   |   | 492.4 | 1.39E−05 | −1.98E−04 | 2.82E−03 |
|   | $(Ti_{0.5}Zr_{0.5})NiSn$ | 197.8 | 1.70E−05 | −1.92E−04 | 2.17E−03 |
|   |   | 296.0 | 1.64E−05 | −2.02E−04 | 2.49E−03 |
|   |   | 394.2 | 1.51E−05 | −2.04E−04 | 2.76E−03 |
|   |   | 492.0 | 1.41E−05 | −1.99E−04 | 2.82E−03 |
|   | $(Ti_{0.5}Zr_{0.5})NiSn$ | 197.9 | 1.69E−05 | −1.89E−04 | 2.12E−03 |
|   |   | 296.1 | 1.64E−05 | −2.01E−04 | 2.45E−03 |
|   |   | 394.2 | 1.51E−05 | −2.03E−04 | 2.71E−03 |
|   |   | 492.1 | 1.41E−05 | −1.97E−04 | 2.76E−03 |
|   |   | 590.7 | 1.30E−05 | −1.81E−04 | 2.53E−03 |
|   | TiNiSn | 199.2 | 4.45E−06 | −7.33E−05 | 1.21E−03 |
|   |   | 297.7 | 4.64E−06 | −7.94E−05 | 1.36E−03 |
|   |   | 395.9 | 4.64E−06 | −8.36E−05 | 1.51E−03 |
|   |   | 493.9 | 4.71E−06 | −8.40E−05 | 1.50E−03 |
|   | TiNiSn | 198.6 | 4.50E−06 | −7.17E−05 | 1.14E−03 |
|   |   | 297.0 | 4.68E−06 | −7.77E−05 | 1.29E−03 |
|   |   | 395.2 | 4.67E−06 | −8.11E−05 | 1.41E−03 |
|   |   | 493.2 | 4.74E−06 | −8.30E−05 | 1.45E−03 |
|   | TiNiSn | 198.4 | 4.39E−06 | −7.20E−05 | 1.18E−03 |
|   |   | 296.7 | 4.58E−06 | −7.93E−05 | 1.37E−03 |
|   |   | 394.8 | 4.58E−06 | −8.36E−06 | 1.53E−03 |
|   |   | 492.8 | 4.64E−06 | −8.47E−05 | 1.55E−03 |
|   | $(Ti_{0.5}Zr_{0.5})$ NiSn Book mold alloy | 198.5 | 5.04E−06 | −4.87E−05 | 4.70E−04 |
|   |   | 296.9 | 5.46E−06 | −6.69E−05 | 8.21E−04 |
|   |   | 395.1 | 5.30E−06 | −7.92E−05 | 1.18E−03 |
|   |   | 493.0 | 5.23E−06 | −8.07E−05 | 1.24E−03 |

EXAMPLE 2

Electrolytic iron (purity: 99 mass % or more), ferrovanadium (Fe—V, JIS FV1, V purity: 87 mass %) and Al metal were weighed to give a Heusler-type $Fe_2(V_xTi_{1-x})(Al_ySi_{1-y})$ (0<x<1, 0<y<1) composition after casting, and high-frequency melted at a temperature up to 1,700° C. under 0.1 MPa in an Ar atmosphere. Thereafter, by using a strip casting apparatus 120 shown in FIG. 1, the molten metal was poured from the crucible 11 through the tundish 12 on the water-cooled copper roll 13 rotating at a spherical velocity of 0.9 m/sec to produce an alloy flake 15, and the alloy flake was recovered in the recovery box 14. The average thickness of the alloy flake 15 was 0.28 mm. In this casting, the cooling rate was estimated to be about 7×10²° C./sec.

Figure 5:
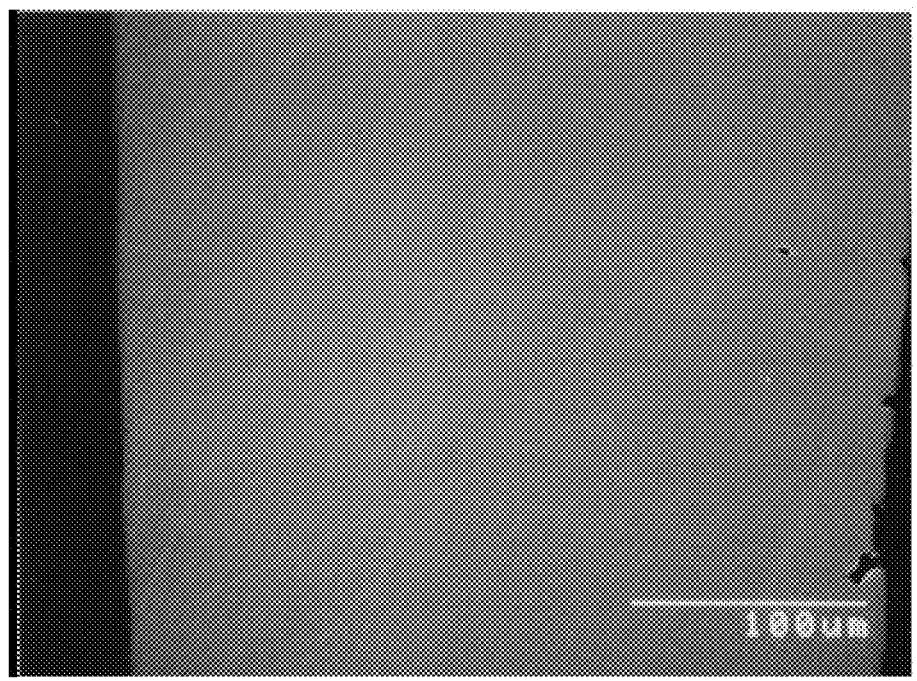
FIG. 5 is a backscattered electron image of quench-solidified $Fe_2VAl$ alloy.
Figure 6:
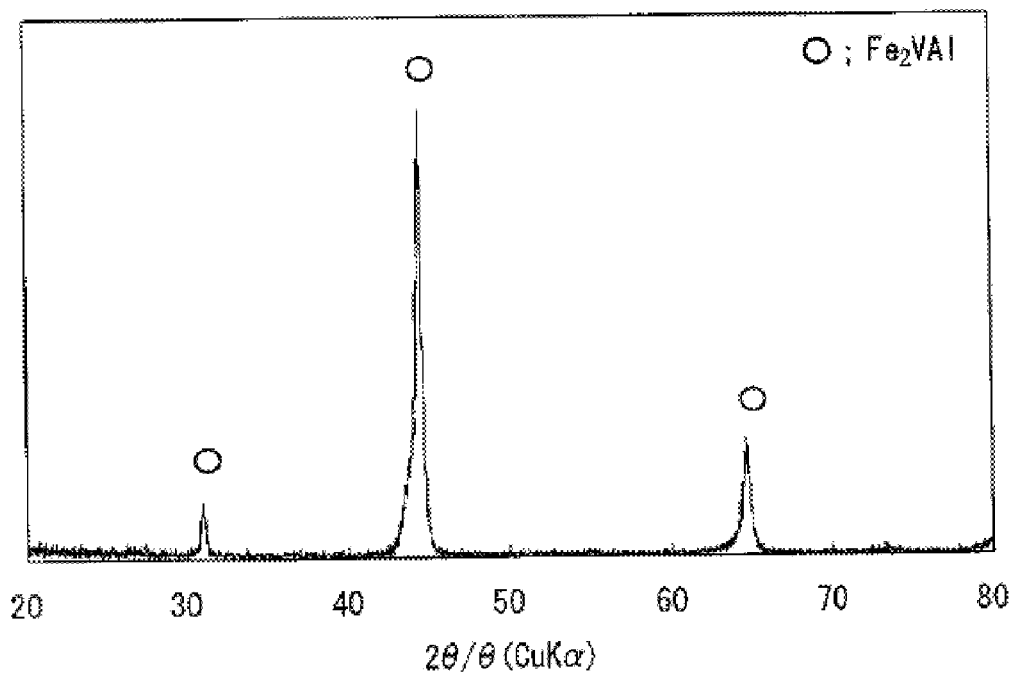
FIG. 6 is an X-ray diffraction pattern of quench-solidified $Fe_2VAl$ alloy.

FIG. 5 is a backscattered electron image showing the cross section of the alloy obtained, and FIG. 6 is a powder X-ray diffraction pattern of the alloy. As seen from these, a Heusler alloy comprising a single phase can be obtained by the quench-solidification method. The ratio of strongest peak of the $Fe_2VAl$ was 100%.

This alloy was ground to 200 μm or less by a stamp mill and then pulverized at 0.5 MPa in a nitrogen steam by a jet mill, NPK-100NP™ manufactured by Nippon Pneumatic Mfg. Co., Ltd. The average particle size d50 of the obtained powder was 13 μm. The yield of the powder was 60% based on the amount charged. The obtained powder was shaped into a size of 15 mm×15 mm×30 mm under a shaping pressure of 3.0 t/cm² by a shaping machine in a glove box controlled to an oxygen concentration of 300 ppm or less, and then kept at 1,380° C. for 3 hours in vacuum, thereby obtaining a sintered body.

A block of 4 mm×4 mm×15 mm was cut out from the sintered body and measured for the Seebeck coefficient α, electric conductivity ρ and power factor Pf=α²/ρ at 200 to 500° C. by using a thermoelectric property evaluating apparatus, ZEM-2™ manufactured by ULVAC, Inc. These measurement results are shown in Table 3.

TEST EXAMPLE 1

La metal (purity: 95 mass % or more, balance of Ce and unavoidable impurities) was used as the rare earth metal, and electrolytic iron (purity: 99 mass % or more), Sb metal (purity: 99 mass % or more) and substituting metal M (purity: 99 mass % or more) were weighed to give a replacement ratio shown in Table 1. These metals were melted at a temperature up to 1,400° C. under 0.1 MPa in an Ar atmosphere. Thereafter, the molten metal was cast to produce an alloy flake by using a strip casting apparatus shown in FIG. 1. At this time, the molten metal was poured on the water-cooled copper roll rotating at a peripheral velocity of 0.92 m/sec under the conditions such that the crosswise width was 85 mm and the poured amount of molten metal was 150 g/sec. The average thickness of the alloy flake was from 0.26 to 0.28 mm. The cooling rate of the molten metal from 1,400° C. to 800° C. was about 600° C./sec, that is, the time required for cooling from 1,400° C. to 800° C. was about 1 second.

This alloy was ground to 200 μm or less by a disc mill and then pulverized at 0.5 MPa in a nitrogen steam by a jet mill, NPK-100NP™ manufactured by Nippon Pneumatic Mfg. Co., Ltd. At this time, d50 was from 2.5 to 4.0 μm.

The obtained powder was shaped into a size of about 15 mm×15 mm×30 mm by a shaping machine in a glove box controlled to an oxygen concentration of 300 ppm or less, and then kept at 780 to 820° C. for 3 hours in an argon stream, thereby obtaining a sintered body.

A block of 4 mm×4 mm×15 mm was cut out from the sintered body and measured for the Seebeck coefficient and electric conductivity in the range of 200 to 500° C. by using a thermoelectric property evaluating apparatus, ZEM-2™ manufactured by ULVAC, Inc., and the power factor Pf=α²/ρ was calculated. Out of these measurement results, the thermoelectric properties at 489° C. are shown in Table 3.

In Table 3, based on the sample where x=1.0 and y=0, when the power factor surpassed the basis, this was judged "effective" (○), and when lower than the basis, this was judged "not effective" (x).

TEST EXAMPLE 2

Ce metal (purity: 95% or more, balance of La and unavoidable impurities) was used as the rare earth metal, and Co metal (purity: 99 mass % or more), Sb metal (purity: 99 mass % or more) and substituting metal M (purity: 99 mass % or more) were weighed to give a replacement ratio shown in Table 4. These metals were melted at a temperature up to 1,400° C. under 0.1 MPa in an Ar atmosphere. Thereafter, the molten metal was cast to produce an alloy flake by using a strip casting apparatus shown in FIG. 1. At this time, the molten metal was poured on the water-cooled copper roll rotating at a peripheral velocity of 0.92 m/sec under the conditions such that the crosswise width was 85 mm and the poured amount of molten metal was 150 g/sec. The average thickness of the alloy flake was the same as in Test Example 1.

This alloy was ground to 200 μm or less by a disc mill and then pulverized at 0.5 MPa in a nitrogen steam by a jet mill, NPK-100NP™ manufactured by Nippon Pneumatic Mfg. Co., Ltd. At this time, d50 was from 2.5 to 4.0 μm.

The obtained powder was shaped into a size of about 15 mm×15 mm×30 mm by a shaping machine in a glove box controlled to an oxygen concentration of 300 ppm or less, and then kept at 870 to 920° C. for 3 hours in an argon stream, thereby obtaining a sintered body.

A block of 4 mm×4 mm×15 mm was cut out from the sintered body and measured for the Seebeck coefficient and electric conductivity in the range of 200 to 500° C. by using a thermoelectric property evaluating apparatus, ZEM-2™ manufactured by ULVAC, Inc., and the power factor $Pf=\alpha^2/\rho$ was calculated. Out of these measurement results, the thermoelectric properties at 489° C. are shown in Table 4.

In Table 1, based on the sample where x=1.0 and y=0, when the power factor surpassed the basis, this was judged "effective" (○), and when lower than the basis, this was judged "not effective" (×).

TABLE 3

$RE_x(Fe_{1-y}M_y)_4Sb_{12}$

| Rare Earth Metal RE | Ratio x | Substituting Metal M | Ratio y | Resistivity $\rho$ ($\Omega \cdot m$) | Seebeck Coefficient $\alpha$ (V/° C.) | Power Factor $Pf = \alpha^2/\rho$ | Judgment |
|---|---|---|---|---|---|---|---|
| La | 1.00 | none | | 6.32E−06 | 1.14E−04 | 2.07E−03 | basis |
| | | Sn | 0.020 | 5.43E−06 | 1.11E−04 | 2.28E−03 | ○ |
| | | | 0.040 | 5.91E−06 | 1.20E−04 | 2.45E−03 | ○ |
| | | Pb | 0.002 | 6.90E−06 | 1.26E−04 | 2.29E−03 | ○ |
| | | | 0.011 | 6.96E−06 | 1.28E−04 | 2.34E−03 | ○ |
| | | | 0.023 | 6.21E−06 | 1.21E−04 | 2.35E−03 | ○ |
| | | Ti | 0.010 | 5.45E−06 | 1.15E−04 | 2.44E−03 | ○ |
| | | | 0.047 | 6.42E−06 | 1.26E−04 | 2.46E−03 | ○ |
| | | | 0.094 | 5.75E−06 | 1.24E−04 | 2.67E−03 | ○ |
| | | | 0.140 | 5.67E−06 | 1.13E−04 | 2.24E−03 | ○ |
| | | Zr | 0.025 | 6.19E−06 | 1.25E−04 | 2.52E−03 | ○ |
| | | | 0.052 | 6.28E−06 | 1.22E−04 | 2.37E−03 | ○ |
| | | Al | 0.155 | 5.18E−06 | 9.38E−05 | 1.70E−03 | × |
| | | Si | 0.150 | 4.49E−06 | 8.62E−05 | 1.66E−03 | × |
| | 0.50 | none | | 3.60E−06 | 5.35E−05 | 7.95E−04 | × |
| | 0.75 | none | | 4.58E−06 | 7.81E−05 | 1.33E−03 | × |
| Yb | 1.00 | none | | 3.81E−06 | 6.48E−05 | 1.06E−03 | × |
| Sm | 1.00 | none | | 3.89E−06 | 4.38E−05 | 4.94E−04 | × |
| Gd | 1.00 | none | | 3.81E−06 | 2.77E−05 | 2.01E−04 | × |

TABLE 4

$RE_x(Co_{1-y}M_y)_4Sb_{12}$

| Rare Earth Metal RE | Ratio x | Substituting Metal M | Ratio y | Resistivity $\rho$ ($\Omega \cdot m$) | Seebeck Coefficient $\alpha$ (V/° C.) | Power Factor $Pf = \alpha^2/\rho$ | Judgment |
|---|---|---|---|---|---|---|---|
| Ce | 1.00 | none | | 4.84E−06 | −1.10E−04 | 2.51E−03 | basis |
| | | Cu | 0.007 | 4.64E−06 | −1.14E−04 | 2.81E−03 | ○ |
| | | | 0.036 | 4.58E−06 | −1.17E−04 | 3.00E−03 | ○ |
| | | | 0.073 | 4.83E−06 | −1.15E−04 | 2.74E−03 | ○ |
| | | Ni | 0.078 | 5.80E−06 | −1.26E−04 | 2.73E−03 | ○ |
| | | Zn | 0.007 | 4.81E−06 | −1.14E−04 | 2.71E−03 | ○ |
| | | | 0.035 | 5.75E−06 | −1.26E−04 | 2.75E−03 | ○ |
| | | | 0.071 | 5.38E−06 | −1.23E−04 | 2.79E−03 | ○ |
| | | Bi | 0.023 | 1.06E−05 | −1.32E−04 | 1.65E−03 | × |
| | | Mn | 0.083 | 5.54E−06 | −8.40E−05 | 1.27E−03 | × |
| | | Cu & Zn | 0.018 0.017 | 5.08E−06 | −1.20E−04 | 2.84E−03 | ○ |
| | 0.25 | none | | 3.26E−05 | −2.21E−04 | 1.50E−03 | × |
| | 0.50 | none | | 6.62E−06 | −1.58E−04 | 3.75E−03 | ○ |
| | 0.75 | none | | 5.27E−06 | −1.34E−04 | 3.38E−03 | ○ |
| Yb | 1.00 | none | | 5.13E−06 | −9.45E−05 | 1.74E−03 | × |

TABLE 4-continued $RE_x(Co_{1-y}M_y)_4Sb_{12}$

| Rare Earth Metal RE | Ratio x | Substituting Metal M | Ratio y | Resistivity $\rho$ ($\Omega \cdot m$) | Seebeck Coefficient $\alpha$ (V/°C.) | Power Factor $Pf = \alpha^2/\rho$ | Judgment |
|---|---|---|---|---|---|---|---|
| Sm | 1.00 | none | | 1.12E−05 | −1.18E−04 | 1.24E−03 | x |
| Gd | 1.00 | none | | 3.33E−04 | −4.67E−05 | 6.54E−06 | x |

REFERENCE EXAMPLE 1

La metal was used as the rare earth metal, and this metal and additionally electrolytic iron and Sb were weighed to give a stoichiometric composition of $LaFe_4Sb_{12}$, melted at a temperature up to 1,400° C. under 0.1 MPa in an Ar atmosphere. Thereafter, the molten metal was cast to produce an alloy flake having a thickness of 0.28 mm by using a strip casting apparatus shown in FIG. 1. At this time, the molten metal was poured on the water-cooled copper roll rotating at a peripheral velocity of 0.92 m/sec under the conditions such that the crosswise width was 85 mm and the pour rate was 150 g/sec. In this casting, the cooling rate was estimated to be about $1 \times 10^{3}$° C./sec.

When the produced alloy flake was ground and measured by powder X-ray diffraction, as shown in FIG. 9, the peak of $Sb_2Fe$ or Sb was scarcely observed. The abundance ratio of the filled skutterudite phase was calculated from this Figure, as a result, 98% or more was being occupied by the $LaFe_4Sb_{12}$ filled skutterudite phase, and the ratio of $Sb_2Fe$ was 2% or less.

When this alloy flake was further heat-treated at 550° for 1 hour in an Ar flow under atmospheric pressure, the $LaFe_4Sb_{12}$ filled skutterudite phase came to occupy almost 100% in the powder X-ray diffraction measurement. The fine structure and produced phases in the alloy after heat treatment were confirmed in a backscattered electron image, as a result, phase separation was not observed at all and the alloy was almost entirely constituted by a uniform filled skutterudite phase.

REFERENCE EXAMPLE 2

Mischmetal comprising 53 mass % of Ce and 47 mass % of La was used as the rare earth metal, and this metal and additionally electrolytic iron and Sb (99%) were weighed to give a stoichiometric composition of $(Ce_x,La_{1-x})Fe_4Sb_{12}$, melted at a temperature up to 1,400° C. under 0.1 MPa in an Ar atmosphere. Thereafter, the molten metal was cast to produce an alloy flake having a thickness of 0.28 mm by using a strip casting apparatus shown in FIG. 1. At this time, the molten metal was poured on the water-cooled copper roll rotating at a peripheral velocity of 0.92 m/sec under the conditions such that the crosswise width was 85 mm and the pour rate was 150 g/sec.

When the produced alloy was ground and measured by powder X-ray diffraction, 98% or more in terms of the intensity ratio of strongest peak was being occupied by the $(Ce_x,La_{1-x})Fe_4Sb_{12}$ filled skutterudite phase, and the ratio of $Sb_2Fe$ was 2% or less.

When immediately after casting of this alloy, the cooling rate of the container was controlled in an Ar atmosphere under atmospheric pressure to be 2° C./sec in the range from 700° C. to 500° C., the $(Ce_x,La_{1-x})Fe_4Sb_{12}$ filled skutterudite phase came to occupy 99% or more in the powder X-ray diffraction measurement. The fine structure and produced phases in the alloy after heat treatment were confirmed in a backscattered electron image, as a result, phase separation was not observed at all and the entire alloy was constituted by a nearly uniform filled skutterudite phase.

REFERENCE EXAMPLE 3

La metal was used as the rare earth metal, and this metal and additionally electrolytic iron and Sb were weighed to give a stoichiometric composition of $LaFe_4Sb_{12}$, melted at a temperature up to 1,400° C. under 0.2 MPa in an Ar atmosphere. Thereafter, the molten metal was cast to produce an alloy flake having a thickness of 0.28 mm by using a strip casting apparatus shown in FIG. 1. At this time, the molten metal was poured on the water-cooled copper roll rotating at a peripheral velocity of 0.92 m/sec under the conditions such that the crosswise width was 85 mm and the pour rate was 150 g/sec.

When the produced alloy flake was ground and measured by powder X-ray diffraction, 95% or more in terms of the intensity ratio of strongest peak was being occupied by the $LaFe_4Sb_{12}$ filled skutterudite phase, and the ratio of $Sb_2Fe$ was 5% or less.

When this alloy flake was further heat-treated at 550° for 1 hour in an Ar flow under atmospheric pressure, the $LaFe_4Sb_{12}$ filled skutterudite phase came to occupy 99% or more in the powder X-ray diffraction measurement. The fine structure and produced phases in the alloy after heat treatment were confirmed in a backscattered electron image, as a result, phase separation was not observed at all and the entire alloy was constituted by a nearly uniform filled skutterudite phase.

EXAMPLE 3

The alloy described in Reference Example 3 was used as the p-type element, and $CeCo_4Sb_{12}$ was produced in the same manner as in Reference Examples 1 to 3 and used as the n-type element. Each alloy was ground by a jet mill to produce a powder having an average particle size of 2.5 μm, shaped under a pressure of 1.2 t/cm², sintered at 800 to 900° C. in an argon flow and cut into a 2 mm-square element. After plating of Cu as electrode and plating of Ti and Ni as antidiffusion layer, the elements were joined together with an Ag solder at 700° C. to produce a module.

A module comprising 70 pairs of p and n elements was produced by using the device obtained above and measured, as a result, the conversion efficiency was 13% based on the heat input when the low-temperature side was 30° C. and the high-temperature side was 500° C.

COMPARATIVE EXAMPLE 2

La metal was used as the rare earth metal, and this metal and additionally electrolytic iron and Sb were weighed to give a stoichiometric composition of $LaFe_4Sb_{12}$, melted at a temperature up to 1,400° C. in a reduced pressure atmosphere. While keeping the reduced pressure, the molten metal was cast in the same manner as in Example 3 to produce a strip cast alloy having a thickness of 0.28 mm, that is, the molten metal was poured on the water-cooled copper roll rotating at a peripheral velocity of 0.92 m/sec under the conditions such that the crosswise width was 85 mm and the pour rate was 150 g/sec.

When the produced alloy was ground and measured by powder X-ray diffraction, almost the entire was being occupied by $Sb_2Fe$ and Sb. This alloy was further heat-treated, and the fine structure and produced phases were confirmed in a backscattered electron image, as a result, the alloy was found to be constituted by a plurality of phases. Also, the oxygen concentration of this alloy exceeded 0.2 mass %, and the amount of Sb was short of the stoichiometric ratio. From these, it was presumed that a filled skutterudite phase was not obtained because the rare earth metal was eliminated from the skutterudite phase and Sb was evaporated during melting to deviate from the stoichiometric ratio.

COMPARATIVE EXAMPLE 3

La metal was used as the rare earth metal, and this metal and additionally electrolytic iron and Sb were weighed to give a stoichiometric composition of $LaFe_4Sb_{12}$, melted at a temperature up to 1,400° C. under 0.1 MPa in an Ar atmosphere. Thereafter, the molten metal was poured on a book mold comprising a copper plate having a width of 10 mm and a thickness of 20 mm, at a pour rate of 150 g/sec to produce an alloy.

When the produced alloy was ground and measured by powder X-ray diffraction, almost the entire was being occupied by $Sb_2Fe$ and Sb. This alloy was further heat-treated at 550° C. for 1 hour in an Ar flow under atmospheric pressure, but in the measurement by powder X-ray diffraction, the alloy was being still occupied mostly by $Sb_2Fe$ and a filled skutterudite phase was scarcely observed. When the fine structure and produced phases were confirmed in a backscattered electron image, the alloy was found to be constituted by a plurality of phases. The oxygen concentration of this alloy was 0.1 mass % or less and the amount of Sb was nearly stoichiometric, but it seemed that heat treatment for a very long time was necessary for causing this alloy to be constituted by a uniform filled skutterudite phase.

COMPARATIVE EXAMPLE 4

Alloys for p-type $LaFe_4Sb_{12}$ and n-type $CeCo_4Sb_{12}$ elements were produced by the method of Comparative Example 3 and each alloy was ground by a jet mill without passing through heat treatment to obtain a powder having an average particle size of 2.5 μm, shaped under a pressure of 1.2 $t/cm^2$, sintered at 800 to 900° C. in an argon flow and cut into a 2 mm-square element. After plating of Cu as electrode and plating of Ti and Ni as antidiffusion layer, the elements were joined together with an Ag solder at 700° C. to produce a module.

A module comprising 70 pairs of p and n elements was produced by using the device obtained above and measured, as a result, the conversion efficiency was 8% based on the heat input when the low-temperature side was 30° C. and the high-temperature side was 500° C.

TEST EXAMPLE 3

La metal (purity: 95 mass % or more) was used as the rare earth metal, and electrolytic iron (purity: 99 mass % or more), Sb metal (purity: 99 mass % or more) and substituting metal M (purity: 99 mass % or more) were weighed to give a replacement ratio x shown in Table 5. These metals were melted at a temperature up to 1,400° C. under 0.1 MPa in an Ar atmosphere. Thereafter, the molten metal was cast to produce an alloy flake by using a strip casting apparatus shown in FIG. 1. At this time, the molten metal was poured on the water-cooled copper roll rotating at a peripheral velocity of 0.92 m/sec under the conditions such that the crosswise width was 85 mm and the poured amount of molten metal was 150 g/sec. The average thickness of the alloy flake was from 0.26 to 0.28 mm.

This alloy was ground to 200 μm or less by a disc mill and then pulverized at 0.5 MPa in a nitrogen steam by a jet mill, NPK-100™ manufactured by Nippon Pneumatic Mfg. Co., Ltd. At this time, d50 was from 2.5 to 4.0 μm.

The obtained powder was shaped into a size of about 15 mm×15 mm×30 mm by a shaping machine in a glove box controlled to an oxygen concentration of 300 ppm or less, and then kept at 780 to 820° C. for 3 hours in an argon stream, thereby obtaining a sintered body.

A block of 4 mm×4 mm×15 mm was cut out from the sintered body and measured for the Seebeck coefficient and electric conductivity in the range of 200 to 500° C. by using a thermoelectric property evaluating apparatus, ZEM-2™ manufactured by ULVAC, Inc., and the power factor $Pf=\alpha^2/\rho$ was calculated. Out of these measurement results, the thermoelectric properties at 489° C. are shown in Table 5.

In Table 5, based on the sample where the metal was not replaced, when the power factor surpassed the basis, this was judged "effective" (⊚), and when lower than the basis, this was judged "not effective" (×).

TEST EXAMPLE 4

Ce metal (purity: 95% or more) was used as the rare earth metal, and Co metal (purity: 99% or more), Sb (purity: 99% or more) and substituting metal M (purity: 99% or more) were weighed to give a replacement ratio x shown in Table 6. These metals were melted at a temperature up to 1,400° C. under 0.1 MPa in an Ar atmosphere. Thereafter, the molten metal was cast to produce an alloy flake by using a strip casting apparatus shown in FIG. 1. At this time, the molten metal was poured on the water-cooled copper roll rotating at a peripheral velocity of 0.92 m/sec under the conditions such that the crosswise width was 85 mm and the poured amount of molten metal was 150 g/sec. The average thickness of the alloy flake was the same as in Test Example 3.

This alloy was ground to 200 μm or less by a disc mill and then pulverized at 0.5 MPa in a nitrogen steam by a jet mill, NPK-100™ manufactured by Nippon Pneumatic Mfg. Co., Ltd. At this time, d50 was from 2.5 to 4.0 μm.

The obtained powder was shaped into a size of about 15 mm×15 mm×30 mm by a shaping machine in a glove box controlled to an oxygen concentration of 300 ppm or less, and then kept at 870 to 920° C. for 3 hours in an argon stream, thereby obtaining a sintered body.

A block of 4 mm×4 mm×15 mm was cut out from the sintered body and measured for the Seebeck coefficient and electric conductivity in the range of 200 to 500° C. by using a thermoelectric property evaluating apparatus, ZEM-2™ manufactured by ULVAC, Inc., and the power factor $Pf=\alpha^2/\rho$ was calculated. Out of these measurement results, the thermoelectric properties at 489° C. are shown in Table 6.

In Table 6, based on the sample where the metal was not replaced, when the power factor surpassed the basis, this was judged "effective" (◎), and when lower than the basis, this was judged "not effective" (×).

TABLE 5

| Substituting Metal M | Replacement Ratio x | Resistivity ρ (Ω·m) | Seebeck Coefficient α (V/° C.) | Power Factor Pf | Judgment |
|---|---|---|---|---|---|
| Sn | 0.040 | 5.91E−06 | 1.20E−04 | 2.45E−03 | ◎ |
|  | 0.020 | 5.43E−06 | 1.11E−04 | 2.28E−03 | ◎ |
| Pb | 0.023 | 6.21E−06 | 1.21E−04 | 2.35E−03 | ◎ |
|  | 0.011 | 6.96E−06 | 1.28E−04 | 2.34E−03 | ◎ |
|  | 0.002 | 6.90E−06 | 1.26E−04 | 2.29E−03 | ◎ |
| Ti | 0.140 | 5.67E−06 | 1.13E−04 | 2.24E−03 | ◎ |
|  | 0.094 | 5.75E−06 | 1.24E−04 | 2.67E−03 | ◎ |
|  | 0.047 | 6.42E−06 | 1.26E−04 | 2.46E−03 | ◎ |
|  | 0.010 | 5.45E−06 | 1.15E−04 | 2.44E−03 | ◎ |
| Zr | 0.052 | 6.28E−06 | 1.22E−04 | 2.37E−03 | ◎ |
|  | 0.025 | 6.19E−06 | 1.25E−04 | 2.52E−03 | ◎ |
| Al | 0.155 | 5.18E−06 | 9.38E−05 | 1.70E−03 | X |
| Si | 0.150 | 4.49E−06 | 8.62E−05 | 1.66E−03 | X |
| None | 0.000 | 6.32E−06 | 1.14E−04 | 2.07E−03 | X |

TABLE 6

| Substituting Metal M | Replacement Ratio x | Resistivity ρ (Ω·m) | Seebeck Coefficient α (V/° C.) | Power Factor Pf | Judgment |
|---|---|---|---|---|---|
| Cu | 0.073 | 4.83E−06 | −1.15E−04 | 2.74E−03 | ◎ |
|  | 0.036 | 4.58E−06 | −1.17E−04 | 3.00E−03 | ◎ |
|  | 0.007 | 4.64E−06 | −1.14E−04 | 2.81E−03 | ◎ |
| None | 0.000 | 4.84E−06 | −1.10E−04 | 2.51E−03 | X |

INDUSTRIAL APPLICABILITY

The rare earth-containing alloys in the present invention can be used as a thermoelectric conversion element for a thermoelectric conversion system.

The thermoelectric conversion system can be used as a waste heat recovery system, a solar heat utilizing system, a co-generation system, and an automobile using the thermoelectric power generating device.

The invention claimed is:

1. A process for producing a rare earth alloy comprising: heating a raw material alloy to be a molten alloy, and quench-solidifying the molten alloy, wherein the raw material alloy is compounded so as to have a composition represented by the formula: $RE_x(Co_{1-y}M_y)_4Sb_{12}$ (wherein RE is at least either one member of La and Ce, M is at least one member selected from the group consisting of Cu, Zn and Ni, $0<x\leqq1$, and $0.01\leqq y\leqq0.15$), and the lower limit of y is more than an impurity.

2. The process for producing a rare earth alloy as set forth in claim 1, wherein the quench-solidifying is performed at a rate more than $1\times10^{2}$° C./sec.

3. The process for producing a rare earth alloy as set forth in claim 1, wherein the quench-solidifying is performed at a rate of $1\times10^{2}$ to $1\times10^{3}$° C./sec.

4. The process for producing a rare earth alloy as set forth in claim 1, wherein the quench-solidifying between a temperature of 1500 to 1700° C. is performed at a rate of $1\times10^{2}$ to $1\times10^{3}$° C./sec.

5. The process for producing a rare earth alloy as set forth in claim 1, wherein the quench-solidifying is performed by a strip casting method.

6. The process for producing a rare earth alloy as set forth in claim 1, wherein the rare earth alloy is one selected from the group consisting of a Heusler alloy, a half Heusler alloy, and a skutterudite alloy.

* * * * *